(12) United States Patent
Shimakawa et al.

(10) Patent No.: US 8,472,238 B2
(45) Date of Patent: *Jun. 25, 2013

(54) VARIABLE RESISTANCE NONVOLATILE STORAGE DEVICE WITH OXYGEN-DEFICIENT OXIDE LAYER AND ASYMMETRIC SUBSTRATE BIAS EFFECT

(75) Inventors: Kazuhiko Shimakawa, Osaka (JP); Yoshihiko Kanzawa, Osaka (JP); Satoru Mitani, Osaka (JP); Shunsaku Muraoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/534,315

(22) Filed: Jun. 27, 2012

(65) Prior Publication Data
US 2012/0281453 A1 Nov. 8, 2012

Related U.S. Application Data

(62) Division of application No. 13/310,894, filed on Dec. 5, 2011, now Pat. No. 8,233,311, which is a division of application No. 12/676,933, filed as application No. PCT/JP2008/003769 on Dec. 15, 2008, now Pat. No. 8,094,485.

(30) Foreign Application Priority Data

May 22, 2008 (JP) ................................. 2008-134815

(51) Int. Cl.
*G11C 11/00* (2006.01)
(52) U.S. Cl.
USPC ...................... 365/148; 365/163; 365/189.09
(58) Field of Classification Search
USPC .............................. 365/148, 158, 163, 189.09
See application file for complete search history.

(56) References Cited

U.S. PATENT DOCUMENTS 7,558,100 B2   7/2009   Ahn et al.
7,919,774 B2   4/2011   Kawashima et al.
(Continued)

FOREIGN PATENT DOCUMENTS

JP   2002-537627   11/2002
JP   2005-025914   1/2005
(Continued)

OTHER PUBLICATIONS

International Search Report issued Mar. 17, 2009 in International (PCT) Application No. PCT/JP2008/003769.

(Continued)

*Primary Examiner* — Andrew Q Tran
(74) *Attorney, Agent, or Firm* — Wenderoth, Lind & Ponack, L.L.P.

(57) ABSTRACT

The variable resistance nonvolatile storage device includes a memory cell (300) that is formed by connecting in series a variable resistance element (309) including a variable resistance layer (309*b*) which reversibly changes based on electrical signals each having a different polarity and a transistor (317) including a semiconductor substrate (301) and two N-type diffusion layer regions (302*a*, 302*b*), wherein the variable resistance layer (309*b*) includes an oxygen-deficient oxide of a transition metal, lower and upper electrodes (309*a*, 309*c*) are made of materials of different elements, a standard electrode potential $V_1$ of the lower electrode (309*a*), a standard electrode potential $V_2$ of the upper electrode (309*c*), and a standard electrode potential $V_t$ of the transition metal satisfy $V_t<V_2$ and $V_1<V_2$, and the lower electrode (309*a*) is connected with the N-type diffusion layer region (302*b*), the electrical signals being applied between the lower and upper electrodes (309*a*, 309*c*).

19 Claims, 29 Drawing Sheets

U.S. PATENT DOCUMENTS

| | | |
|---|---|---|
| 7,995,374 B2 | 8/2011 | Komura et al. |
| 8,094,485 B2 * | 1/2012 | Shimakawa et al. ......... 365/148 |
| 8,233,311 B2 * | 7/2012 | Shimakawa et al. ......... 365/148 |
| 2004/0264244 A1 | 12/2004 | Morimoto |
| 2005/0185445 A1 | 8/2005 | Osada et al. |
| 2006/0279983 A1 | 12/2006 | Hachino et al. |
| 2007/0159871 A1 | 7/2007 | Osada et al. |
| 2007/0165442 A1 | 7/2007 | Hosoi et al. |
| 2007/0200158 A1 | 8/2007 | Genrikh et al. |
| 2008/0048165 A1 | 2/2008 | Miyazawa |
| 2009/0097300 A1 | 4/2009 | Ishihara et al. |

FOREIGN PATENT DOCUMENTS

| | | |
|---|---|---|
| JP | 2005-267837 | 9/2005 |
| JP | 2006-190376 | 7/2006 |
| JP | 2006-344295 | 12/2006 |
| JP | 2007-180202 | 7/2007 |
| JP | 2007-188603 | 7/2007 |
| JP | 3989506 | 7/2007 |
| JP | 2007-235139 | 9/2007 |
| JP | 2007-258533 | 10/2007 |
| JP | 2008-028228 | 2/2008 |
| WO | 00/49659 | 8/2000 |
| WO | 2007/083362 | 7/2007 |
| WO | 2008/029446 | 3/2008 |
| WO | 2008/059701 | 5/2008 |
| WO | 2008/107941 | 9/2008 |

OTHER PUBLICATIONS

David R. Lide, Editor-in-Chief, "CRC Handbook of Chemistry and Physics", 84th Edition, 2003-2004, CRC Press, pp. 8-21 to 8-31.

* cited by examiner

FIG. 3
(a)
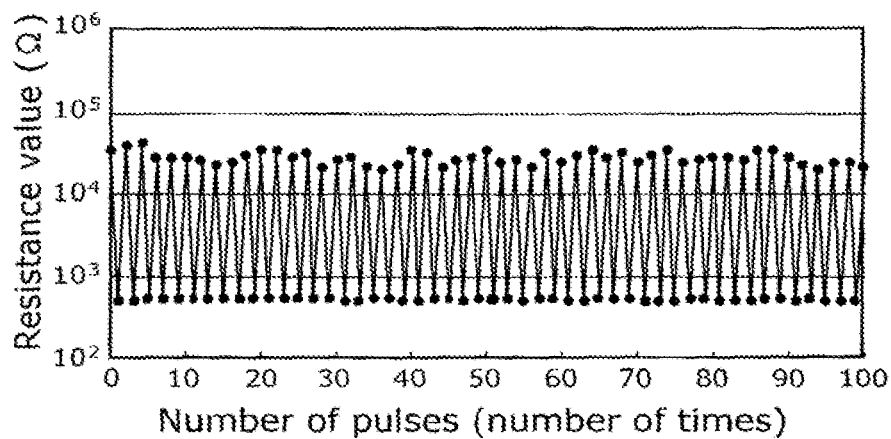
(b)
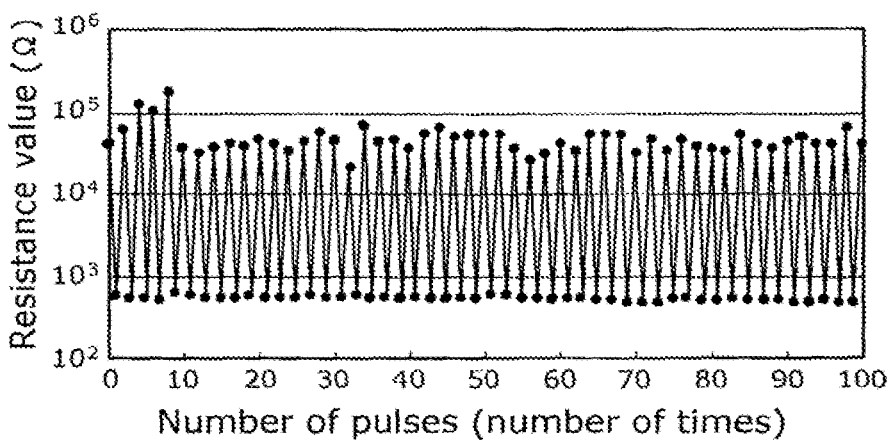

FIG. 6
(a)
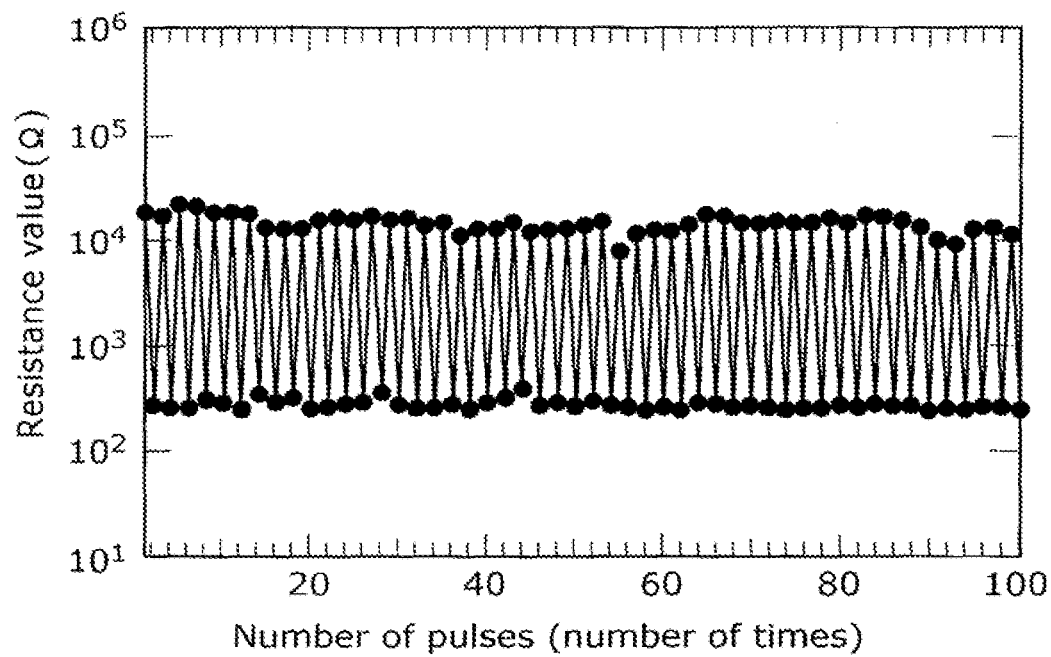
(b)
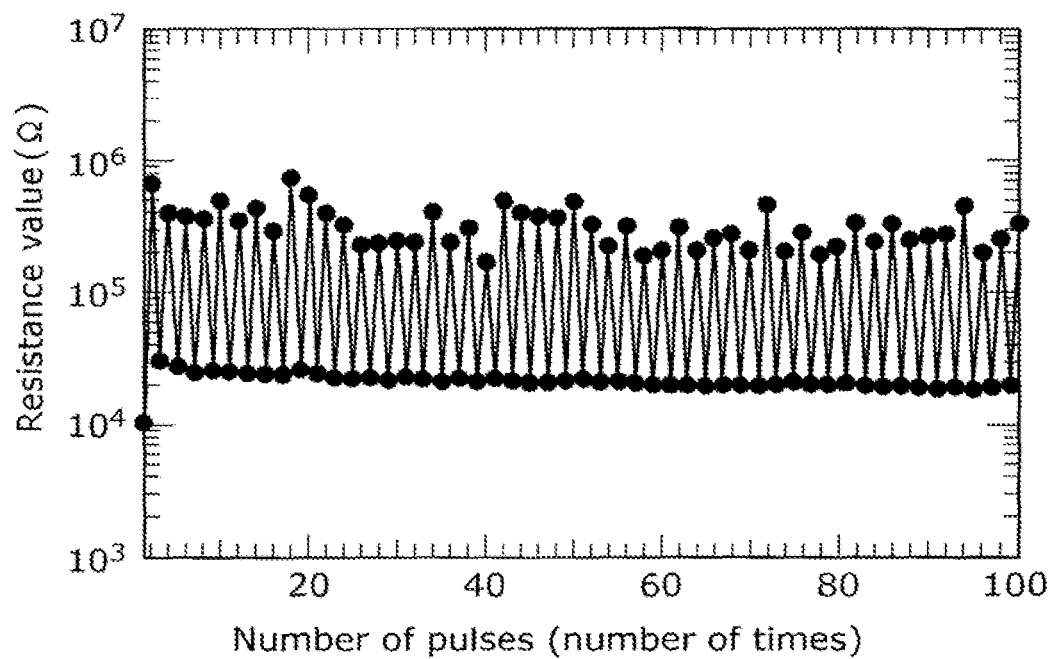

FIG. 16
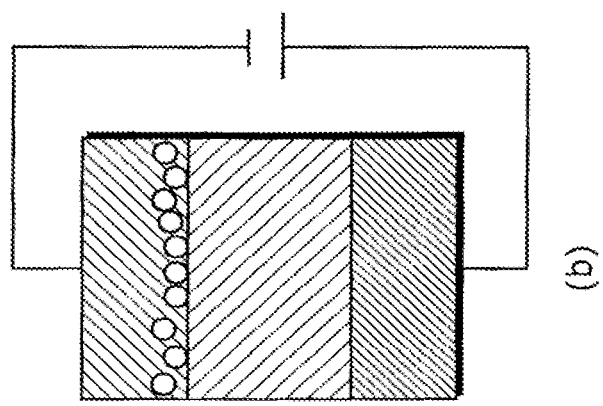
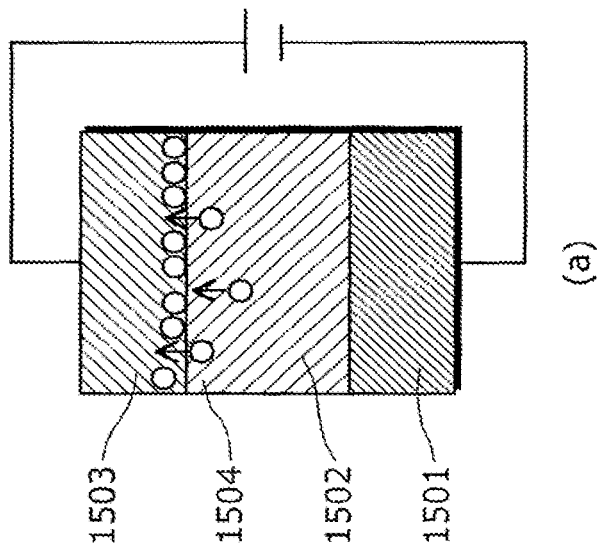

FIG. 18
(a)
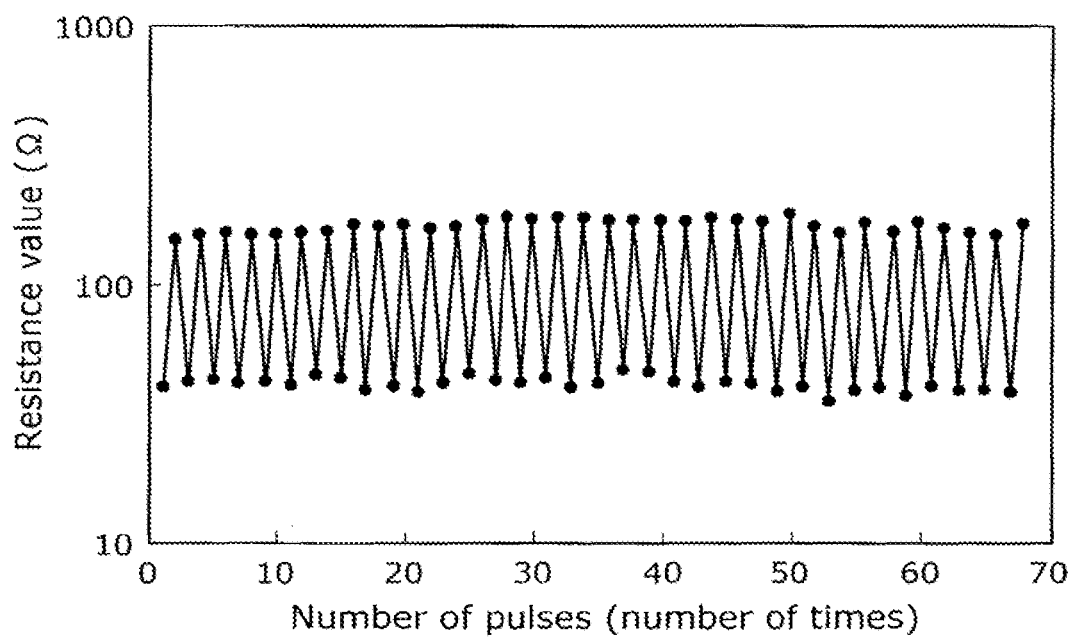
(b)
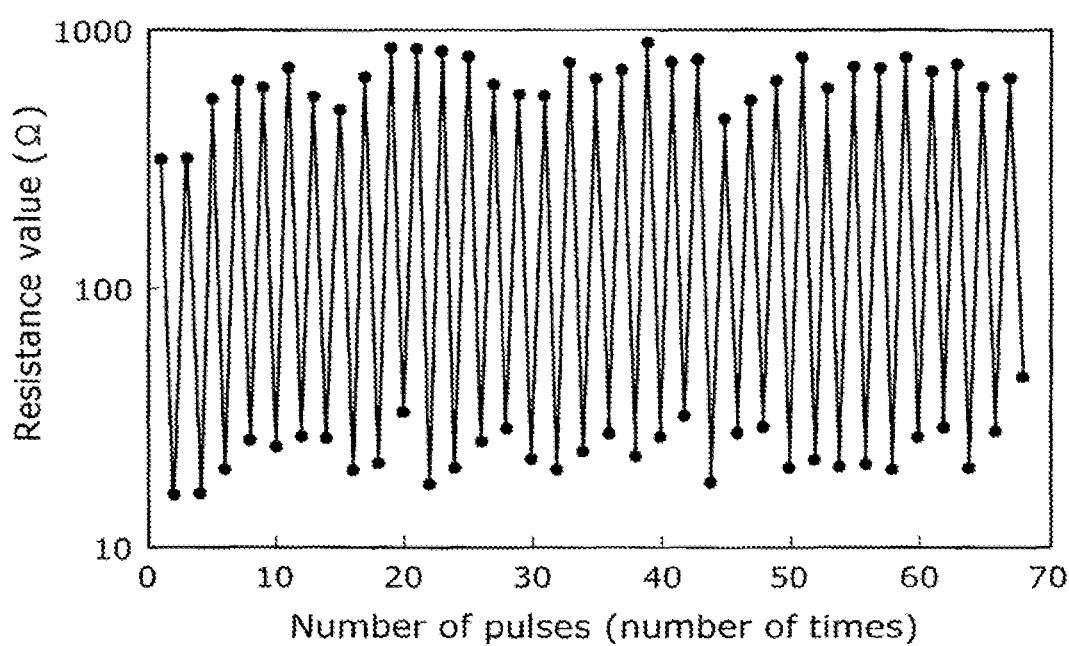

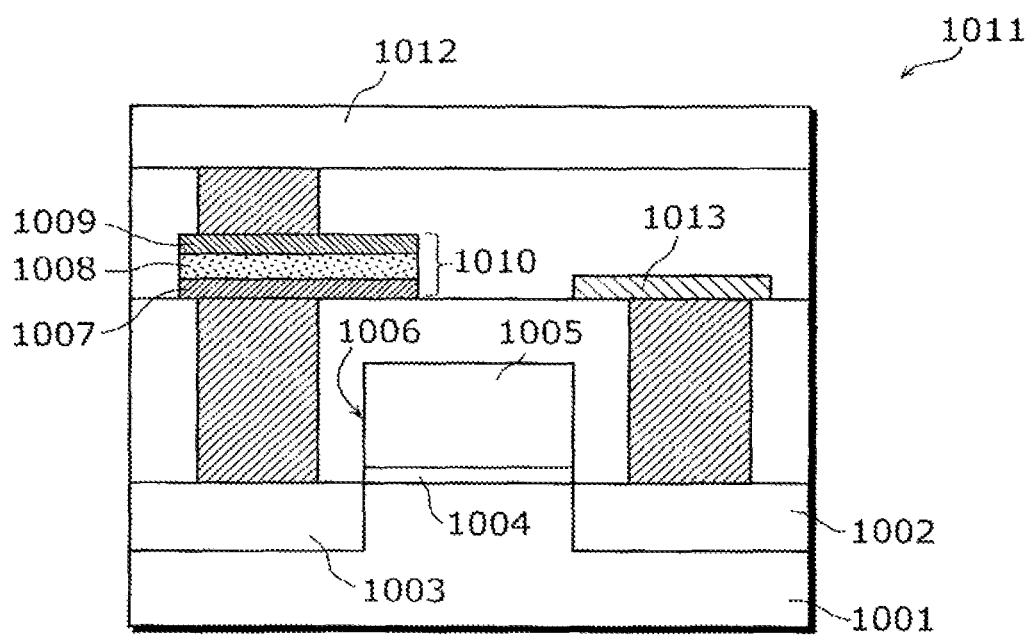
Fig. 28 - PRIOR ART

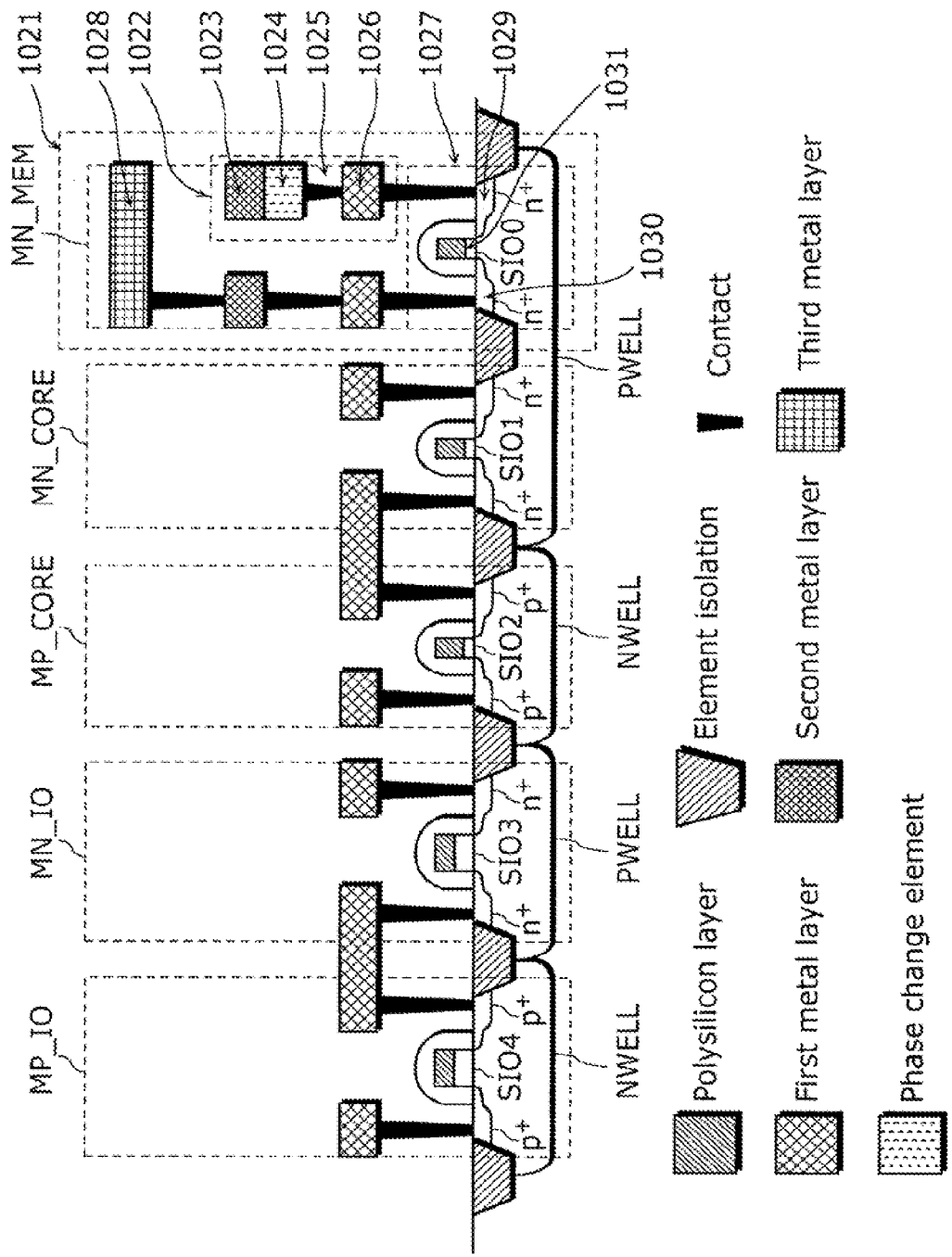
FIG. 29 - PRIOR ART

VARIABLE RESISTANCE NONVOLATILE STORAGE DEVICE WITH OXYGEN-DEFICIENT OXIDE LAYER AND ASYMMETRIC SUBSTRATE BIAS EFFECT

This application is a divisional application of Ser. No.13/310,894, filed Dec. 5, 2011 now U.S. Pat. No. 8,233,311 which is a divisional application of Ser. No. 12/676,933, now U.S. Pat. No. 8,094,485, filed Mar. 8, 2010 which is the U.S. National Stage of International Application PCT/JP2008/003769, filed Dec. 15, 2008, which are hereby incorporated by reference in their entirety.

TECHNICAL FIELD

The present invention relates to a variable resistance nonvolatile storage device having memory cells each of which includes a transistor and a variable resistance element in which a resistance value reversibly changes based on electrical signals.

BACKGROUND ART

In recent years, research and development projects regarding nonvolatile storage devices having memory cells structured with variable resistance elements have been moved forward. A variable resistance element is an element which has a property that a resistance value reversibly changes based on electrical signals and further can store data corresponding to the resistance value in a nonvolatile manner.

Commonly known as a nonvolatile storage device including variable resistance elements is a nonvolatile storage device including memory cells, that is, so-called 1T1R memory cells each formed by connecting in series a MOS transistor and a variable resistance element, each of which is array-arranged in a matrix at a position where a bit line intersects a word line and a source line that are arranged to be orthogonal to the bit line.

Patent Reference 1 discloses a nonvolatile storage device including 1T1R memory cells in which oxides having a perovskite-type crystal structure are used as variable resistance elements.

FIG. 28 is a schematic view of a section of a memory cell described therein.

A memory cell 1011 is structured by electrically connecting a transistor 1006 and a variable resistance element 1010 in series.

The transistor 1006 includes a source region 1002 that is the first diffusion layer region formed on a semiconductor substrate 1001, a drain region 1003 that is the second diffusion layer region, and a gate electrode 1005 formed on a gate oxide film 1004.

The variable resistance element 1010 is structured by locating, between a lower electrode 1007 and an upper electrode 1009, a variable resistance layer 1008 in which a resistance value changes based on voltage application.

The drain region 1003 and the lower electrode 1007 are electrically connected to each other.

The upper electrode 1009 is connected to a metal line that is a bit line 1012, the gate electrode 1005 is connected to a word line, and the source region 1002 is connected to a metal line that is a source line 1013.

Here, although $Pr_{1-x}Ca_xMnO_3$ (PCMO), $La_{1-x}Ca_xMnO_3$ (LCMO), and so on are disclosed as materials used for the variable resistance layer 1008, no reference to electrode materials is specifically made.

Furthermore, disclosed is a method for writing into the memory cell 1011 which can change a low resistance state into a high resistance state when a pulse voltage Vpp, a pulse voltage Vss, and a pulse voltage Vwp having a predetermined voltage magnitude are applied to the upper electrode 1009, the source region 1002, and the gate electrode, respectively, and inversely can change the high resistance state into the low resistance state when the pulse voltage Vss, the pulse voltage Vpp, and the predetermined pulse voltage Vwe are applied to the upper electrode 1009, the source region 1002, and the gate electrode, respectively.

Patent Reference 2 discloses a nonvolatile storage device including 1T1R memory cells in which variable resistance elements having a variable resistance principle different from that of the variable resistance elements in which the resistance change occurs based on the abovementioned electrical signals. This storage device is called a phase-change memory.

The phase-change memory stores data by taking advantage of a situation where a phase-change material called a chalcogenide material has a different resistance in a crystalline state and an amorphous state. Rewriting is performed by changing the state by passing a current to the phase-change material to cause the phase-change material to generate heat at near a melting point. A high resistance change (amorphization) called a reset operation is performed by control for maintaining the phase-change material at a relatively high temperature, and a low resistance change (crystallization) called a set operation is performed by control for maintaining the phase-change material at a relatively low temperature for a sufficient period.

Moreover, it is disclosed that a current required for data rewriting is different for the reset operation and the set operation, and that the, reset operation requires a relatively larger current.

FIG. 29 is a cross section of the phase-change memory disclosed in Patent Reference 2.

A memory cell 1021 is formed in a 1T1R structure using a storage unit 1022 and an NMOS transistor 1027. The NMOS transistor 1027 includes N-type diffusion layer regions 1029 and 1030 respectively corresponding to a source and a drain and a gate electrode 1031 located between the N-type diffusion layer regions.

The storage unit 1022 includes a phase change element 1024, a second metal line layer 1023 above the phase change element 1024, and a contact via 1025 and a first metal line layer 1026 below the phase change element 1024, and is connected to the N-type diffusion layer region 1029 of the NMOS transistor 1027.

The opposite-side N-type diffusion layer region 1030 of the NMOS transistor 1027 is connected to a third metal line layer 1028 via each of line layers.

Here, the second metal line layer 1023, the third metal line layer 1028, and the gate electrode 1031 of the NMOS transistor 1027 correspond to a source line, a bit line, and a word line, respectively.

Patent Reference 2 discloses adopting a mechanism for controlling source lines to a phase-change memory device and switching a direction of passing a current in a set operation and a reset operation.

A source line and a bit line are set to a predetermined high level and a low level, respectively, in the reset operation in which a relatively large current needs to be passed, and the bit line and the source line are set to the predetermined high level and the low level, respectively, in the set operation in which a relatively small current suffices.

A direction of a current in the reset operation is a direction in which a source potential of the NMOS transistor 1027 of the memory cell (in this case, corresponding to a potential of the N-type diffusion layer region 1030) is maintained at a low level almost equal to a potential of a semiconductor substrate. For this reason, since an influence of a so-called substrate bias effect of the MOS transistor is reduced, the reset operation is performed in a situation where a drive capability of the transistor is high (a large current is obtained).

On the other hand, a direction of a current in the set operation is a direction in which the source potential of the NMOS transistor 1027 of the memory cell (in this case, corresponding to a potential of the N-type diffusion layer region 1029) rises to a voltage value determined by a divided voltage relationship between an on-resistance value of the NMOS transistor 1027 and a resistance value of the phase-change element 1024. For this reason, the influence of the so-called substrate bias effect of the MOS transistor is increased, and the set operation is performed in a situation where a current flowing through the transistor is relatively kept small.

The above structure makes it easier to distinguish and supply a current having a magnitude suitable for each of the set operation and the reset operation, and allows a result of each operation to be stably obtained.

Generally, however, in order to structure a high density memory cell array, it is necessary to decrease an area of each of memory cells as much as possible, and thus it is important to decrease an area of a variable resistance element, a component of a memory cell, and an area of a transistor as much as possible.

In order to decrease the area of the transistor as much as possible, it is effective to structure a gate length L of the transistor as short as possible and a gate width W of the transistor as exact and little as possible.

This is applied to the nonvolatile storage device disclosed in Patent Reference 1.

According to Patent Reference 1, the nonvolatile storage device shown in FIG. 28 changes (increases a resistance) a low resistance state of the memory cell 1011 into a high resistance state by applying a positive voltage to the upper electrode 1009 with reference to the lower electrode 1007, that is, setting the bit line 1012 and the source line 1013 to Vpp and 0V, respectively.

Here, a potential of the source region 1002 (in this case, the source region 1002 functions as a source of the transistor 1006) that is the first diffusion layer region of the transistor 1006 is almost equal to a potential of the semiconductor substrate 1001, that is, 0V, and the substrate bias effect occurring in the transistor 1006 is minimized.

On the other hand, the nonvolatile storage device changes the high resistance state of the memory cell 1011 into the low resistance state (performs a low resistance change) by setting the bit line 1012 and the source line 1013 to 0V and Vpp, respectively.

Here, a potential of the drain region 1003 (in this case, the drain region 1003 functions as a source of the transistor 1006) that is the second diffusion layer region rises to a divided voltage between the resistance value of the variable resistance element 1010 and the on-resistance of the transistor 1006, and the substrate bias effect occurring in the transistor 1006 is greater in comparison with the case of the high resistance change.

As stated above, since performing the high resistance change with the current in the direction, in which the substrate bias effect occurring in the transistor is reduced more, does not require the driving capability of the transistor to have an unnecessary margin, the performing is rational in structuring the transistor of the memory cell with optimum dimensions, the high resistance change requiring a larger current than the low resistance change.

It is to be noted that the semiconductor device disclosed in Patent Reference 2 adopts the same concept in that the reset operation requiring the larger current is performed with the current in the direction, in which the substrate bias effect occurring in the transistor is reduced more.

Patent Reference 1: Japanese Unexamined Patent Application Publication No. 2005-25914 (FIG. 2)
Patent Reference 2: Japanese Unexamined Patent Application Publication No. 2005-267837 (FIGS. 7 and 8)

DISCLOSURE OF INVENTION

Problems that the Invention is to Solve

Inventors of the present application have examined, as one of variable resistance nonvolatile storage devices, a variable resistance nonvolatile storage device including 1T1R memory cells each having a variable resistance layer made of an oxygen-deficient oxide of a transition metal.

Here, the oxygen-deficient oxide is an oxide whose composition is deficient of oxygen compared to its stoichiometric composition. In an example of Ta (tantalum) that is one of transition metals, $Ta_2O_5$ is the oxide having the stoichiometric composition. $Ta_2O_5$ contains O (oxygen) 2.5 times greater than the tantalum, which is 71.4% when expressed with an oxygen content percentage. An oxide whose oxygen content percentage is lower than the oxygen content percentage 71.4%, that is, a tantalum oxide having non-stoichiometric composition which is expressed as $TaO_x$ and satisfies $0<x<2.5$ is called an oxygen-deficient tantalum oxide.

The following describes properties of a variable resistance element having a variable resistance layer made of the oxygen-deficient tantalum oxide, in order to facilitate description of problems to be solved.

FIG. 1 is a schematic view showing a basic structure of a variable resistance element used for measurement. An oxygen-deficient tantalum oxide is used for a variable resistance layer 3302 of the variable resistance element. The variable resistance element is structured to be top-and-bottom symmetry by locating the variable resistance layer 3302 between a lower electrode 3301 and an upper electrode 3303, both of which are made of Pt (platinum).

Hereinafter, the nonvolatile element is called an element A. It is to be noted that Table 1 shows a relationship between names of elements and electrode materials including elements to be described in an embodiment.

TABLE 1

| Name of Element | Lower Electrode Material | Upper Electrode Material |
| --- | --- | --- |
| A | Pt | Pt |
| B | Pt | Pt |
| C | W | W |
| D | Ta | Ta |
| E | TaN | TaN |
| F | W | Pt |
| G | W | Ir |
| H | W | Ag |
| I | W | Cu |
| J | W | Ni |
| K | W | Ta |
| L | W | Ti |
| M | W | Al |
| N | W | TaN |

FIG. 2 is a graph showing hysteretic current-voltage characteristics showing an example of a situation of a resistance change of the element A. The horizontal axis of the graph indicates a voltage of the upper electrode 3303 with reference to the lower electrode 3301, and the vertical axis of the same indicates a value of a current flowing through the element A.

In FIG. 2, as a positive voltage is gradually applied to the upper electrode 3303 with reference to the lower electrode 3301, a current virtually increases in proportion to the voltage, and when the positive voltage exceeds a positive voltage indicated by point A, the current rapidly decreases. To put it differently, FIG. 2 shows a situation where a low resistance state is changed into a high resistance state (high resistance change).

On the other hand, as a negative voltage is gradually applied to the upper electrode 3303 with reference to the lower electrode 3301 (equivalent to the application of the positive voltage to the lower electrode 3301 with reference to the upper electrode 3303) in the high resistance state, the current rapidly increases when the negative voltage exceeds a negative voltage indicated by point B. Stated differently, FIG. 2 shows a situation where the high resistance state is changed into the low resistance state (low resistance change).

Although the variable resistance element indicating the characteristics shown in FIG. 2 and the variable resistance element disclosed in Patent Reference 1 differ in the material of the variable resistance layer, both have the following in common: switching between the high resistance state and the low resistance state with a bidirectional applied voltage, that is, a bipolar operation; the high resistance change by applying the positive voltage to the upper electrode with reference to the lower electrode; and the low resistance change by applying the negative voltage to the upper electrode with reference to the lower electrode.

In addition, the characteristics shown in FIG. 2 indicate that it is not until the point A is passed that the high resistance change occurs and the low resistance change occurs after the point B is passed. It is clear from the characteristics that the high resistance change of the variable resistance element according to the present invention requires a larger current in comparison with the low resistance change.

As stated above, performing the high resistance change by the application of the voltage of a polarity in which the substrate bias effect occurring in the transistor is reduced more and performing the low resistance change by the application of the voltage of an opposite polarity are rational in structuring the transistor of the memory cell with optimum dimensions, the high resistance change requiring a larger current, and a smaller current being sufficient for the low resistance change.

However, the inventors of the present application have discovered during the examination that a voltage application direction (driving polarity) stably causing a resistance change in a direction (the low resistance change or the high resistance change) is not always uniform, and that variable resistance elements differ in the driving polarity, the variable resistance elements being made of the same material using Pt for the upper and lower electrodes and the oxygen-deficient tantalum oxide for the variable resistance layer.

For instance, a variable resistance element has been verified to perform a low resistance change by applying a pulse voltage of +2.0V amplitude and 100 ns width to an upper electrode 3303 and a lower electrode 3301, and to perform a high resistance change by applying a pulse voltage of −2.6V amplitude and 100 ns width thereto, with a high voltage of the upper electrode 3303 being positive with reference to the lower electrode 3301.

In addition, another variable resistance element has been verified to perform the low resistance change by applying a pulse voltage of −2.0V amplitude and 100 ns width to an upper electrode 3303 and a lower electrode 3301, and to perform the high resistance change by applying a pulse voltage of +2.7V amplitude and 100 ns width thereto, with a high voltage of the upper electrode 3303 being positive with reference to the lower electrode 3301.

FIGS. 3(a) and 3(b) are graphs each showing a resistance value of each of these variable resistance elements every time alternate application of a pulse voltage causing a low resistance change and a pulse voltage causing a high resistance change is continuously performed. The horizontal axis of the graph indicates the number of electric pulses, and the vertical axis of the same indicates the resistance value.

As shown in FIG. 3(a), the variable resistance element is initially in a high resistance state of approximately 33 k$\Omega$, application of a pulse voltage of +2.0V causes the variable resistance element to be in a low resistance of approximately 500$\Omega$, and then after application of a pulse voltage of −2.6V causes the variable resistance element to be in a high resistance state of approximately 40 k$\Omega$, a low resistance change by applying the positive pulse voltage to the upper electrode 3303 with reference to the lower electrode 3301 and a high resistance change by applying the negative pulse voltage to the upper electrode 3303 with reference to the lower electrode 3301 are repeated.

A relationship between a direction of the resistance change and a polarity of an applied voltage is called A mode for descriptive purposes.

As shown in FIG. 3(b), another variable resistance element is initially in a high resistance state of approximately 42 k$\Omega$, application of a pulse voltage of −2.0V causes another variable resistance element to be in a low resistance state of approximately 600$\Omega$, and then after application of a pulse voltage of +2.7V causes another variable resistance element to be in a high resistance state of approximately 40 k$\Omega$, a low resistance change by applying the negative pulse voltage to the upper electrode 3303 with reference to the lower electrode 3301 and a high resistance change by applying the positive pulse voltage to upper electrode 3303 with reference to the lower electrode 3301 are repeated.

A relationship between a direction of the resistance change and a polarity of an applied voltage is called B mode for descriptive purposes. The hysteretic current-voltage characteristics shown in FIG. 2 correspond to the B mode.

It is to be noted that the above pulse voltage value denotes a set output voltage value of a pulse generator, and that an effective voltage value applied to both end terminals of a variable resistance element is considered to be a voltage value smaller than the pulse voltage value due to a voltage drop across a measurement system.

In the element A from which such a result is obtained, the upper electrode 3303 and the lower electrode 3301 are made of Pt, and the variable resistance layer 3302 which is made of the oxygen-deficient tantalum oxide and located between the upper and lower electrodes has a top and bottom symmetry relationship with the electrodes electrically.

Accordingly, it is not always self-evident as to which of the A mode and the B mode appears as resistance change characteristics, and it is determined based on an empirical rule or an experimental measurement result. It is expected that these phenomena are determined by some sort of an anisotropy factor which is unexplained in a resistance change mechanism.

In the case where the A mode or the B mode appears indeterminately, the following problems are conceivable in structuring a 1T1R memory device.

The first problem is that a size of a transistor cannot be optimized.

If the resistance change characteristics can be limited to one of the A mode and the B mode, assuming that a transistor operates on a condition that a substrate bias effect is small, the transistor can be structured in a minimum size which allows an current necessary for the high resistance change to be driven, according to a conventionally-known concept.

However, if the mode is indeterminate, considering that the transistor operates on a condition that the substrate bias effect is large, it is necessary to structure the transistor in a bigger size which allows the current necessary for the high resistance change to be driven. For this reason, in comparison with the case where the mode can be limited, it is necessary to structure a gate width W of the transistor to be wider in advance. This is a harmful effect on miniaturization of a memory cell size, which is not desirable.

The second problem is that information identifying a mode of resistance change characteristics needs managing.

Since a correspondence between a polarity of a voltage to be applied for changing a resistance state and a resistance state (high resistance state or low resistance state) to be read after the application of the voltage is indeterminate when the mode is indeterminate, the information identifying the mode is necessary for actually using a variable resistance element as a storage element.

For example, in the case where the same mode appears as per lot or slice, a storage element for management is provided in a chip, identification information is stored in the storage element for management in a manufacturing stage, and a polarity of an applied voltage is reversed in an write operation or a polarity of output data is reversed in an read operation in a use stage, the identification information indicating whether a variable resistance element undergoes a resistance change in the A mode or the B mode.

Although, by doing so, it is conceivable that the variable resistance element can be actually used as the storage element, a circuit configuration or a control method becomes complicated, which is not desirable. Further, in the case where a different mode appears as per little finer unit, for instance, memory cell, it is practically impossible to record identification information of a mode by providing the storage element for management to each of memory cells.

The present invention has been devised in consideration of the above situations, and has an object of providing a technique for enabling a 1T1R nonvolatile storage device including a variable resistance element to control appearance of the A mode and the B mode of resistance change characteristics of the variable resistance element, and designing a memory cell with optimal transistor sizes.

Means to Solve the Problems

In order to solve the above problems, a variable resistance nonvolatile storage device of the present invention includes: a semiconductor substrate; a nonvolatile storage element including: a first electrode; a second electrode; and a variable resistance layer in which a resistance value reversibly varies based on electrical signals each having a different polarity, the variable resistance layer being interposed between the first and second electrodes and provided in contact with the first and second electrodes, and the electrical signals being applied between the first and second electrodes; and a MOS transistor formed on a main surface of the semiconductor substrate, wherein the variable resistance layer includes an oxygen-deficient oxide of one of tantalum and hafnium, the first and the second electrodes are made of materials of different elements, a standard electrode potential $V_1$ of the first electrode, a standard electrode potential $V_2$ of the second electrode, and a standard electrode potential $V_t$ of the one of the tantalum and the hafnium satisfy $V_t<V_2$ and $V_1<V_2$, and a drain of the MOS transistor is connected with one of the first and second electrodes of the nonvolatile storage element to form a memory cell so that a substrate bias effect occurring in the MOS transistor when a voltage signal having a polarity which causes a high resistance change in the variable resistance layer is applied to the MOS transistor and the nonvolatile storage element is smaller than a substrate bias effect occurring in said MOS transistor when a voltage signal having a polarity which causes a low resistance change in said variable resistance layer is applied to said MOS transistor and said nonvolatile storage element. Here, the MOS transistor may be an N-type MOS transistor including: a first N-type diffusion layer region formed on a main surface of the semiconductor substrate; a gate; and a second N-type diffusion layer region formed on a side of the gate which is opposite to the first N-type diffusion layer region, and the first electrode may be connected with the first N-type diffusion layer region to form the memory cell.

Furthermore, the variable resistance nonvolatile storage device may further include an N well formed on the main surface of the semiconductor substrate; wherein the MOS transistor may be a P-type MOS transistor including: a first P-type diffusion layer region formed in a region of the N well; a gate; and a second P-type diffusion layer region formed on a side of the gate which is opposite to the first P-type diffusion layer region, and the second electrode may be connected with the first P-type diffusion layer region of the P-type MOS transistor to form a memory cell.

Effects of the Invention

With the nonvolatile storage device of the present invention, since the memory cell is structured using the variable resistance nonvolatile storage element formed by locating the variable resistance layer between the first electrode and the second electrode, a voltage application direction (driving polarity) for resistance change can be uniquely determined in each of the memory cells in order that a high resistance change is performed by applying a positive voltage to the second electrode with reference to the first electrode and a low resistance change is performed by applying the positive voltage to the first electrode with reference to the second electrode, the first electrode being made of an electrode material that are not prone to cause the resistance change in the variable resistance layer and the second electrode being made of an electrode material that are prone to cause the resistance change in the variable resistance layer.

Generally, when the resistance of the variable resistance element is increased, in comparison with a case of decreasing the resistance, a higher driving current is required to generate a voltage necessary for causing the resistance change in the variable resistance element in a state of a low resistance value.

When the memory cell includes the variable resistance element and the N-type MOS transistor, the first electrode of the variable resistance element is connected with the first N-type diffusion layer region of the N-type MOS transistor. With this connection, when the resistance of the variable resistance element is increased, it is possible to ground the second N-type diffusion layer region of the N-type MOS transistor and to supply the driving current to the variable resistance element by a ground bias with which the substrate bias effect is smaller in the N-type MOS transistor.

Moreover, when the memory cell includes the variable resistance element and the P-type MOS transistor, the second electrode of the variable resistance element is connected with the first P-type diffusion layer region of the P-type MOS transistor. With this connection, when the resistance of the variable resistance element is increased, the second N-type diffusion layer region of the P-type MOS transistor is connected to a power source, and it is possible to supply the driving current to the variable resistance element by a power bias with which the substrate bias effect does not easily occur in the P-type MOS transistor.

As a result, in consideration that the transistor operates on a condition that the substrate bias effect is large, it is not necessary to structure the transistor in a bigger size which allows a current necessary for the high resistance change to be driven, and it becomes possible to design the memory cell with the optimum transistor sizes.

Further, the resistance change phenomenon is an interaction between the variable resistance layer and electrode materials, and not only variable resistance materials but also a combination of a variable resistance material with a specific electrode material become of importance. For example, when the variable resistance material used for an electrode is combined with a relatively expensive material such as Pt and Ir (iridium), preferably, the relatively expensive materials is used for one electrode, and a material as inexpensive as possible such as W (tungsten) is used for the other electrode. In such a case, it is possible to surely determine whether connecting which side of the electrodes with the transistor is effective.

In other words, it is possible to realize the variable resistance nonvolatile storage device including the 1T1R memory cells in a small layout area, and to attempt an increase in integration degree and cost reduction.

BRIEF DESCRIPTION OF DRAWINGS

FIGS. 3(a) and 3(b) are diagrams each showing an example of a relationship between a resistance value of the nonvolatile storage element and the number of applied electrical pulses as basic data of the present invention.

FIGS. 6(a) and 6(b) are diagrams each showing an example of a relationship between a resistance value of the nonvolatile storage element and the number of applied electrical pulses as basic data of the present invention.

FIGS. 16(a) and 16(b) are cross-sectional schematic diagrams for describing operations of the nonvolatile storage element as basic data of the present invention.

FIGS. 18(a) and 18(b) are diagrams each showing an example of a relationship between a resistance value of the nonvolatile storage element and the number of applied electrical pulses as basic data of the present invention.

FIG. 28 is a cross-sectional schematic diagram showing a memory cell of a conventional variable resistance nonvolatile storage device.

FIG. 29 is a cross-section diagram of a semiconductor device including a conventional phase-change memory.

Figure 1:
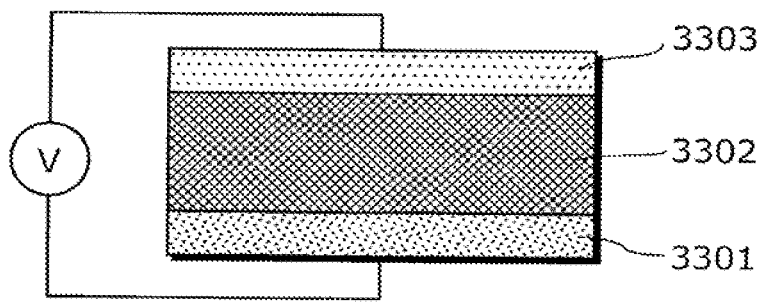
FIG. 1 is a schematic diagram showing a basic structure of a nonvolatile storage element as basic data of the present invention.

| Numerical References | |
|---|---|
| 200 | Nonvolatile storage device |
| 201 | Memory main portion |
| 202 | Memory array |
| 203 | Column selection circuit |
| 204 | Sense amplifier |
| 205 | Data input and output circuit |
| 206 | Write circuit |
| 207 | Row driver |
| 208 | Row selection circuit |
| 209 | Address input circuit |
| 210 | Control circuit |
| 211 | Power source for writing |
| 212 | Power source for low resistance (LR) writing |
| 213 | Power source for high resistance (HR) writing |
| 300 | Memory cell |
| 301 | Semiconductor substrate |
| 302a, 302b | N-type diffusion layer region |
| 303a | Gate insulator film |
| 303b | Gate electrode |
| 304, 306, 308, 310 | Via |
| 305, 307, 311 | Wiring layer |
| 309 | Variable resistance element |
| 309a, 309d | Lower electrode |
| 309b, 309e | Variable resistance layer |
| 309c, 309f | Upper electrode |
| 317 | Transistor |
| 400 | Memory cell |
| 402a, 402b | P-type diffusion layer region |
| 409 | Variable resistance element |
| 417 | Transistor |
| 418 | N well |
| 500 | Nonvolatile storage element |
| 501 | Single-crystal silicon substrate |
| 502 | Oxide layer |
| 503 | Lower electrode |
| 504 | Oxygen-deficient transition metal oxide layer |
| 505 | Upper electrode |
| 506 | Element region |
| 1401, 1501 | Lower electrode |
| 1402, 1502 | Oxygen-deficient tantalum oxide layer |
| 1403, 1503 | Upper electrode |
| 1404, 1504 | Oxygen ion |
| 3301 | Lower electrode |
| 3302 | Variable resistance layer |
| 3303 | Upper electrode |

BEST MODE FOR CARRYING OUT THE INVENTION

The following describes in detail an embodiment of the present invention with reference to the drawings.

A variable resistance nonvolatile storage device according to the embodiment of the present invention is a 1T1R nonvolatile storage device that is structured by connecting a variable resistance element and a MOS transistor in series, fixes a mode of resistance change characteristics of the variable resistance element, and optimizes a structure of the MOS transistor according to the fixed mode.

(Basic Data of the Present Invention)

The following describes, as preparation, basic data regarding two types of variable resistance elements used for the variable resistance nonvolatile storage device of the present invention.

One of the variable resistance elements is structured by locating a variable resistance layer made of an oxygen-deficient tantalum oxide between an upper electrode and a lower electrode that are made of a different material, and the other one of the variable resistance elements is structured by locating a variable resistance layer made of an hafnium oxide between an upper electrode and a lower electrode that are made of a different material.

The variable resistance elements have been invented by the inventors of the present application in order to obtain a nonvolatile storage element having reversible and stable rewriting characteristics and using a resistance change phenomenon, and are respectively described in detail in Japanese Patent Application No. 2007-267583 and Japanese Patent Application No. 2008-121947 (Patent Reference) that are related patent applications.

A feature that the resistance change characteristics held by the variable resistance elements can be fixed to either the aforementioned A mode or B mode is applied to the variable resistance nonvolatile storage device of the present invention. Hereinafter, parts of the related patent applications are cited for purposes of illustration.

It is to be noted that the phrase "variable resistance element" and the phrase "variable resistance nonvolatile storage element (or, briefly, nonvolatile storage element)" are used synonymously in the present DESCRIPTION.

(Variable Resistance Element in which Oxygen-Deficient Tantalum Oxide is Used for Variable Resistance Layer)

First, the following describes the first experiment regarding a variable resistance element for which an oxygen-deficient tantalum oxide is used and which performs a bipolar operation.

In the first experiment, it is verified whether reversible and stable rewriting characteristics are obtained by structuring the nonvolatile storage element for which the oxygen-deficient tantalum oxide is used and which performs the bipolar operation, such that a resistance change easily occurs only in the vicinity of one of the upper electrode and the lower electrode.

For the verification, assuming that a tendency for the resistance change to occur varies depending on an electrode material type, a variable resistance element structured by locating an oxygen-deficient tantalum oxide between an upper electrode and a lower electrode that are made of a different material is formed, and resistance change characteristics are measured.

The following describes a result of the first experiment.

It is to be noted that, before describing a result of the verification, a method for forming an oxygen-deficient tantalum oxide layer and a preferred range of an oxygen content percentage are described.

Then, described is a result of forming a structure in which a $TaO_x$ layer is located between electrodes made of Pt, W, Ta or TaN (tantalum nitride) and of examining a situation of a resistance change phenomenon caused by an electrical pulse, in order to verify whether tendency for a resistance change to occur depends on the electrode materials.

Lastly, described is a measurement result of a resistance change of a variable resistance element structured by locating an oxygen-deficient tantalum oxide layer between an influential electrode material and a non-influential electrode material.

(Relationship Between Oxygen Flow Ratio at Time of Sputtering and Oxygen Content Percentage of Tantalum Oxide Layer)

First, the following describes an analysis result of forming conditions and an oxygen content percentage of an oxygen-deficient tantalum oxide layer in the first experiment.

The oxygen-deficient tantalum oxide layer is formed by sputtering a Ta target in argon (Ar) gas and $O_2$ (oxygen) gas atmosphere, that is, reactive sputtering.

A specific method of forming the oxygen-deficient tantalum oxide layer in the first experiment is as follows.

A substrate is initially placed in a sputtering apparatus, and inside the sputtering apparatus is vacuumed to almost $7 \times 10^{-4}$ Pa. Sputtering is performed with Ta used as a target, power set to 250 W, a total gas pressure of the Ar gas and the $O_2$ gas set to 3.3 Pa, and a preset temperature of the substrate set to 30° C. Here, the flow ratio of the $O_2$ gas to the Ar gas is changed from 0.8% to 6.7%.

First, because of the purpose of examining a composition, silicon (Si) on which 200 nm of $SiO_2$ is deposited is used as the substrate, and a sputtering time period is adjusted so that a film thickness of the tantalum oxide layer is approximately 100 nm.

Figure 4:
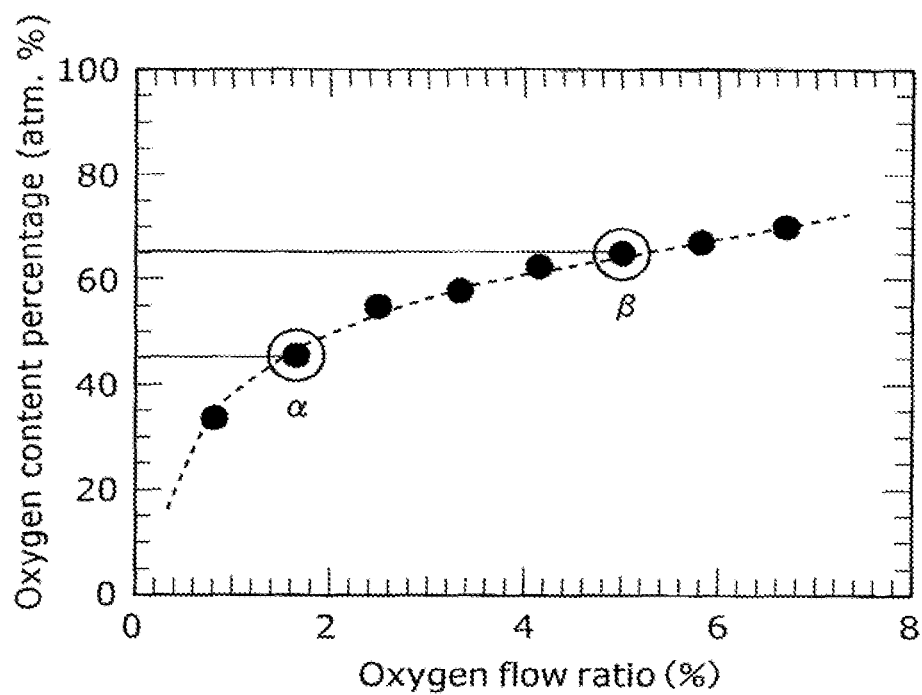
FIG. 4 is a diagram showing an analysis result of a composition of a tantalum oxide layer of the nonvolatile storage element as basic data of the present invention.

FIG. 4 shows a result of analyzing, with the Rutherford Backscattering Spectrometry (RBS) and the Auger Electron Spectroscopy (AES), the composition of the tantalum oxide layer formed in the above manner.

The figure shows that an oxygen content percentage of the tantalum oxide layer is changed from approximately 35 at % ($TaO_{0.66}$) to approximately 70 at % ($TaO_{23}$) when an oxygen partial pressure ratio is changed from 0.8% to 6.7%.

Based on the above result, the following has been clarified: it is possible to control the oxygen content percentage of the tantalum oxide layer with the oxygen flow ratio; and the oxygen-deficient tantalum oxide layer, in which oxygen is more deficient than oxygen content percentage 71.4 at % of $Ta_2O_5(TaO_{2.5})$ that is a stoichiometric oxide of tantalum, is formed.

It is to be noted that although the Rutherford Backscattering Spectrometry (RBS) and the Auger Electron Spectroscopy (AES) are employed in analyzing the tantalum oxide layer, it is also possible to employ an apparatus analytical method such as the X-ray Photoelectron Spectroscopy (XPS) and the Electron Probe Microanalysis (EPMA).

(Composition and Resistance Change Characteristics of Oxygen-Deficient Tantalum Oxide Layer)

It is examined which oxygen-deficient tantalum oxide layer having how much oxygen content percentage among the oxygen-deficient tantalum oxide layers formed in the above manner shows a resistance change. Here, Pt is used as an electrode material for both an upper electrode and a lower electrode between which an oxygen-deficient tantalum oxide layer is located.

Using Pt for the upper electrode and the lower electrode, as stated above, is inappropriate for a bipolar variable resistance nonvolatile element. However, as will be described, Pt is an electrode material which easily shows a resistance change, and is the most suitable material for determining whether or not an oxygen-deficient tantalum oxide layer having a certain oxygen content percentage shows the resistance change.

Figure 5:
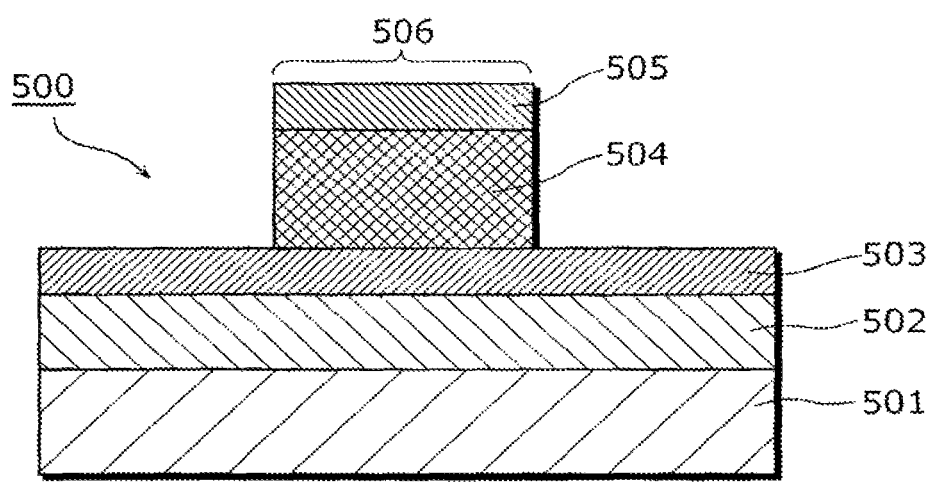
FIG. 5 is a cross-section diagram showing a structure of a nonvolatile storage element as basic data of the present invention.

For all of these reasons, a nonvolatile storage element 500 as shown in FIG. 5 is formed.

In other words, an oxide layer 502 having a thickness of 200 nm is formed on a single-crystal silicon substrate 501 with a thermal oxidation method, and a Pt thin film having a thickness of 100 nm is formed as a lower electrode 503 on the oxide layer 502 with a sputtering method.

Then, an oxygen-deficient tantalum oxide layer 504 is formed with reactive sputtering, with Ta used as a target. In the range examined in the first experiment, the nonvolatile storage element is formed by changing an $O_2$ gas flow ratio from 0.8% to 6.7% in the same manner as the above analysis sample. A film thickness of the oxygen-deficient tantalum oxide layer 504 is 30 nm.

Then, a Pt thin film having a thickness of 150 nm is deposited as an upper electrode 505 on the oxygen-deficient tantalum oxide layer 504 with the sputtering method.

Lastly, an element region 506 is formed by a photolithography process and a dry-etching process. It is to be noted that the element region 506 has a circular pattern having a diameter of 3 μm.

A resistance change phenomenon of the nonvolatile storage element formed in the above manner is measured. As a result, it is satisfactory that a high resistance value is more than five times as large as a low resistance value in the nonvolatile storage element for which a tantalum oxide film represented by from point α (an oxygen flow ratio of approximately 1.7% and an oxygen content percentage of approximately 45 at %) to point β (an oxygen flow ratio of approximately 5% and an oxygen content percentage of approximately 65 at %) shown in FIG. 4 is used.

FIGS. 6(a) and 6(b) each show a result of measuring the resistance change characteristics of the nonvolatile storage element for which the tantalum oxide layer having the oxygen content percentage represented by either the point α or the point β is used with reference to the number of applied pulses.

FIGS. 6(a) and 6(b) each show that it is satisfactory that the high resistance value is more than five times as large as the low resistance value in the element for which the tantalum oxide layer having the oxygen content percentage represented by either the point α or the point β is used.

Thus, it can be said that a composition range in which the oxygen content percentage is 45 to 65 at %, that is, a range of x, $0.8 \leq x \leq 1.9$, when the variable resistance layer is shown as $TaO_x$, is a more appropriate range of the variable resistance layer (the oxygen content percentage=45 at % and the oxygen content percentage=65 at % correspond to x=0.8 and x=1.9, respectively).

(Resistance Change Characteristics of Variable Resistance Element in which W, Ta or TaN is Used as Material of Upper Electrode and Lower Electrode)

Next, the following describes a result of forming a structure in which the oxygen-deficient tantalum oxide layer 504 is located between the lower electrode 503 and the upper electrode 505 that are made of Pt, W, Ta or TaN as a material other than Pt and of examining a situation of a resistance change caused by an electrical pulse, in order to verify whether the tendency for the resistance change to occur depends on the electrode material.

It is to be noted that since an experiment is also performed to evaluate the tendency for the resistance change to occur, the material of the upper and lower electrodes is the same. In addition, an oxygen content percentage of a used oxygen-deficient tantalum oxide is 58 at % ($TaO_{1.38}$) that is almost in the middle of the preferred range of the oxygen content percentage. A method for forming an element is almost same as the method described above, and Pt, W, Ta or TaN is deposited by the sputtering method.

First, for comparison, the following describes resistance change characteristics of a nonvolatile storage element (hereinafter, referred to as element B) including the lower electrode 503 and the upper electrode 505 each of which is a thin film made of Pt.

Figure 7:
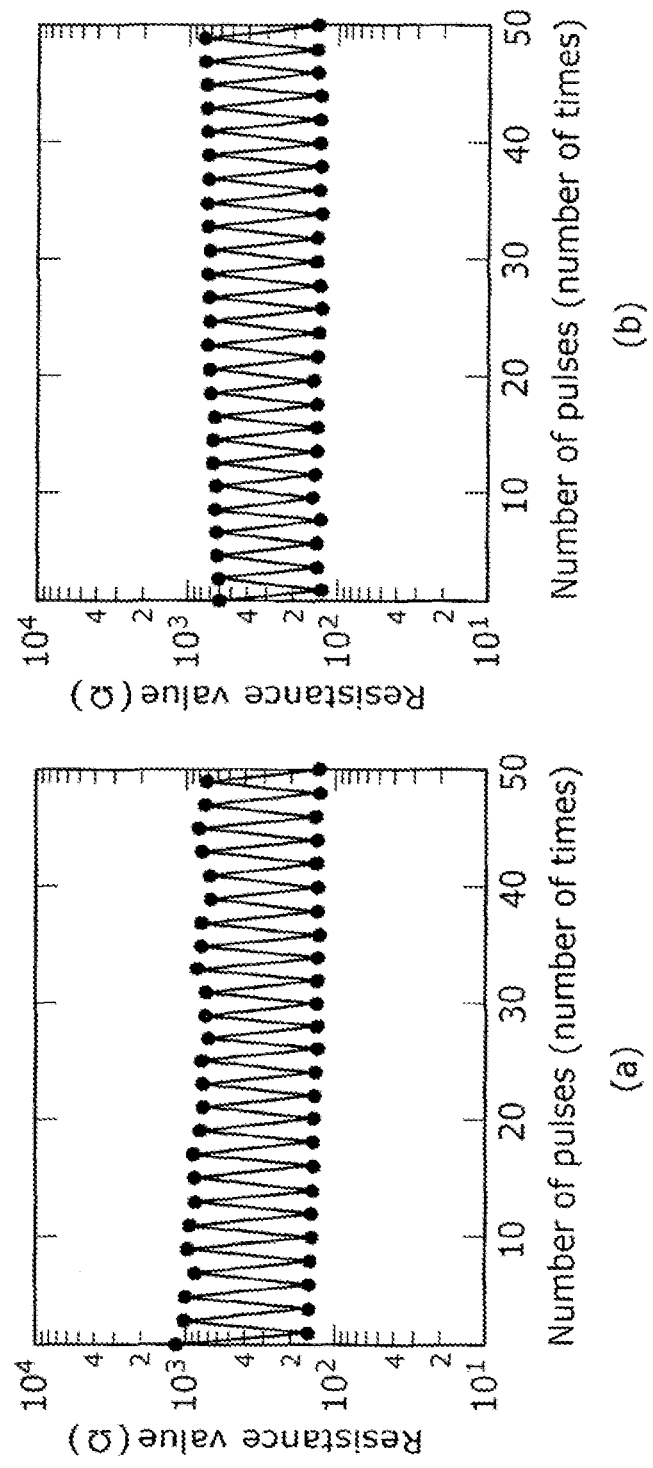
FIGS. 7(a) and 7(b) are diagrams each showing an example of a relationship between a resistance value of the nonvolatile storage element and the number of applied electrical pulses as basic data of the present invention.

FIGS. 7(a) and 7(b) each show a measurement result of a resistance change caused by an electrical pulse in the element B formed in the above manner.

FIG. 7(a) shows a measurement result of resistance when an electrical pulse having a voltage of +3.0V and an electrical pulse having a voltage of −1.5V are alternately applied to the upper electrode 505 with reference to the lower electrode 503, the electrical pulses each having a pulse width of 100 nsec.

In this case, a resistance value becomes approximately 800 to 1000Ω by the application of the electrical pulse having the voltage of +3.0V, and when the electrical pulse having the voltage of −1.5V is applied, the resistance value is changed to approximately 150Ω. To put it differently, when an electrical pulse having a higher voltage than a voltage at the lower electrode 503 is applied to the upper electrode 505, a high resistance change occurs.

Furthermore, though details are omitted, a result of presuming that the resistance change occurs in the vicinity of the upper electrode 505 is obtained from an additional experiment.

Next, FIG. 7(b) shows a result of a case where a negative voltage is increased by changing a balance of a voltage to be applied. In this case, an electrical pulse having a voltage of −3.0V and an electrical pulse having a voltage of +1.5V are applied to the upper electrode 505 with reference to the lower electrode 503. When the electrical pulse of −3.0V is applied, a high resistance change occurs and a resistance value is approximately 600 to 800Ω, and when the electrical pulse of −1.5V is applied, a low resistance change occurs and the resistance value is approximately 150Ω. Stated differently, the low resistance change occurs when the electrical pulse having the higher voltage than the voltage at the lower electrode 503 is applied to the upper electrode 505, which is an operation opposite to the operation at the time of measurement shown in FIG. 7(a).

Moreover, though details are omitted, a result of presuming that the resistance change occurs in the vicinity of the lower electrode 503 is obtained from an additional experiment.

Next, the following describes resistance change characteristics of a nonvolatile storage element (hereinafter, referred to as element C) including the lower electrode 503 and the upper electrode 505 each of which is a thin film made of W.

Figure 8:
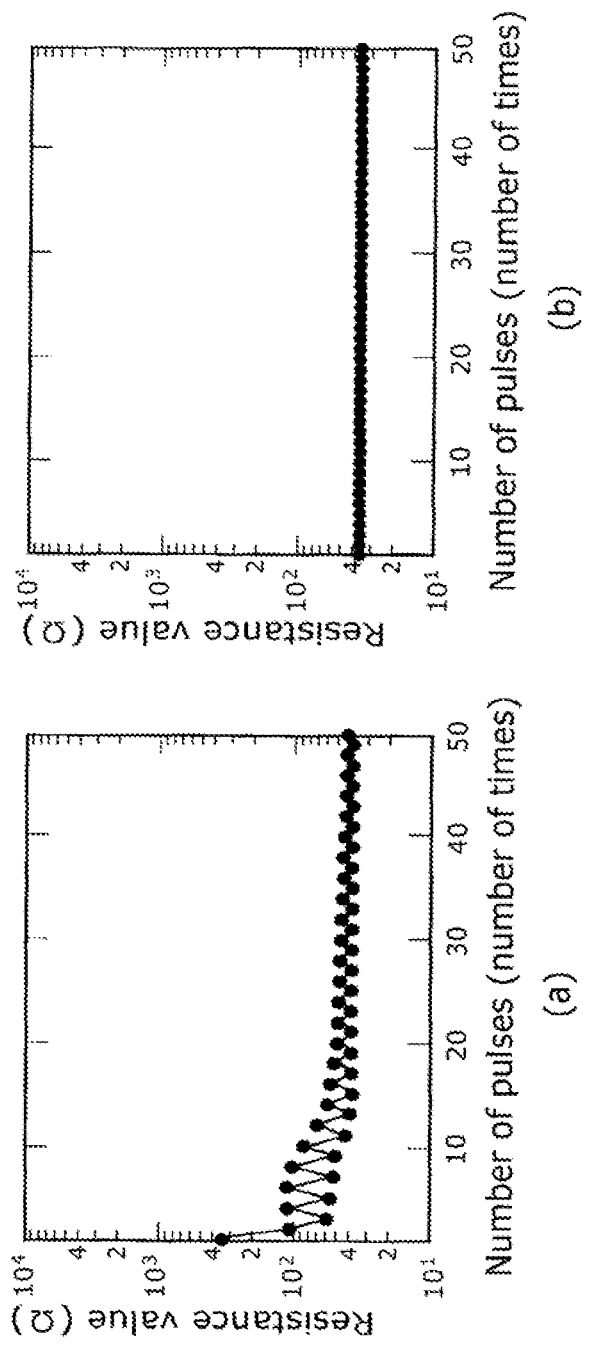
FIGS. 8(a) and 8(b) are diagrams each showing an example of a relationship between a resistance value of the nonvolatile storage element and the number of applied electrical pulses as basic data of the present invention.

FIGS. 8(a) and 8(b) each show a measurement result of a resistance change caused by an electrical pulse in the element C formed in the above manner.

FIG. 8(a) shows a change in a resistance value when +7V and −5V are alternately applied to the upper electrode 505 with reference to the lower electrode 503 in order to cause a resistance change in the vicinity of the upper electrode 505 (upper electrode mode). The upper electrode mode is a mode in which the high resistance change is caused by applying a positive voltage to an upper electrode with reference to a lower electrode, and corresponds to the abovementioned B mode.

As shown in FIG. 8(a), the resistance change, though weak, is observed in the B mode until when the number of pulses is approximately 30, a high resistance change occurs when an electrical pulse of +7V is applied, and a low resistance change occurs when an electrical pulse of −5V is applied. However, when the number of pulses exceeds 30, the resistance change is hardly observed.

FIG. 8(b) shows a change in a resistance value when +5V and −7V are alternately applied to the upper electrode 505 in order to cause a resistance change in the vicinity of the lower electrode 503 (lower electrode mode). The lower electrode mode is a mode in which the high resistance change is caused by applying the positive voltage to the lower electrode with reference to the upper electrode, and corresponds to the abovementioned A mode.

As shown in FIG. 8(b), the change in the resistance value is hardly observed in this case, and the resistance value is constant at approximately 30Ω.

Here, when comparing the result of the element B whose upper and lower electrodes are made of Pt and the result shown in FIG. 8(a), it is clear that the resistance change clearly does not occur easily when W is used for the electrodes.

Whereas an approximately sevenfold change between the resistance value of the low resistance state, 150Ω, and the resistance value of the high resistance state, approximately 1000Ω, is shown in FIG. 7(a) showing the measurement result of the element B, mere occurrence of the resistance change from 50Ω to 100Ω at most even within a range of a large resistance change, that is, an approximately twofold change is shown in FIG. 8(a) showing the measurement result of the element C in which W is used as the electrode material.

While the applied voltages are respectively +3.0V and −1.5V at the time of measurement shown in FIG. 7(a), the resistance change is hardly observed even though very high voltages, +7V and −5V, are applied in FIG. 8(a).

As stated above, it is clear that the resistance change does not occur easily when W is used for the electrodes in comparison with the case where Pt is used for the electrodes.

The above results denote that the operation of the variable resistance element in which the oxygen-deficient tantalum oxide is used for the variable resistance layer very strongly depends on the electrode material to be used. In other words, at least it is clear that the resistance change occurs easily when Pt is used for the electrode and that the resistance change does not occur easily when W is used for the electrode.

Moreover, though details are omitted, a variable resistance element in which Ta or TaN is used for an upper electrode and a lower electrode is formed, and the resistance change characteristics thereof is measured.

Figure 9:
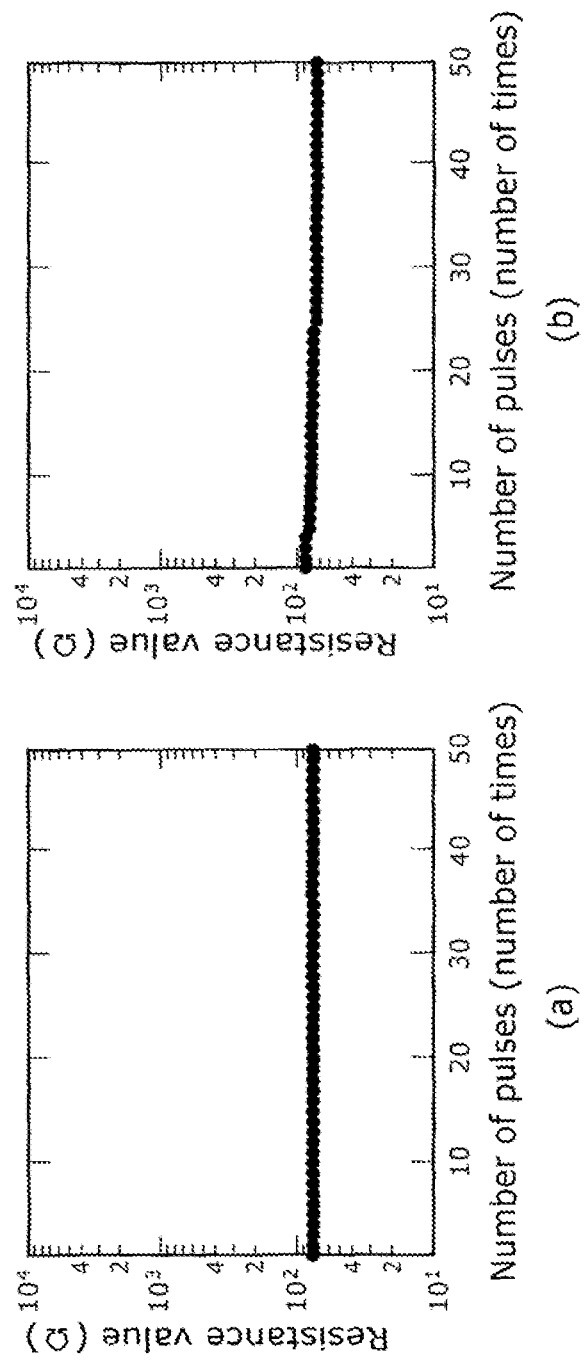
FIGS. 9(a) and 9(b) are diagrams each showing an example of a relationship between a resistance value of the nonvolatile storage element and the number of applied electrical pulses as basic data of the present invention.

FIGS. 9(a) and 9(b) each show resistance change characteristics of an element D in which Ta is used for both the lower electrode 503 and the upper electrode 505.

FIG. 9(a) shows a measurement result when an electrical pulse of +7V and an electrical pulse of −5V are applied to the upper electrode 505, and FIG. 9(b) shows a measurement result when an electrical pulse of +5V and an electrical pulse of −7V are applied to the upper electrode 505. In either case, the resistance change hardly occurs.

Figure 10:
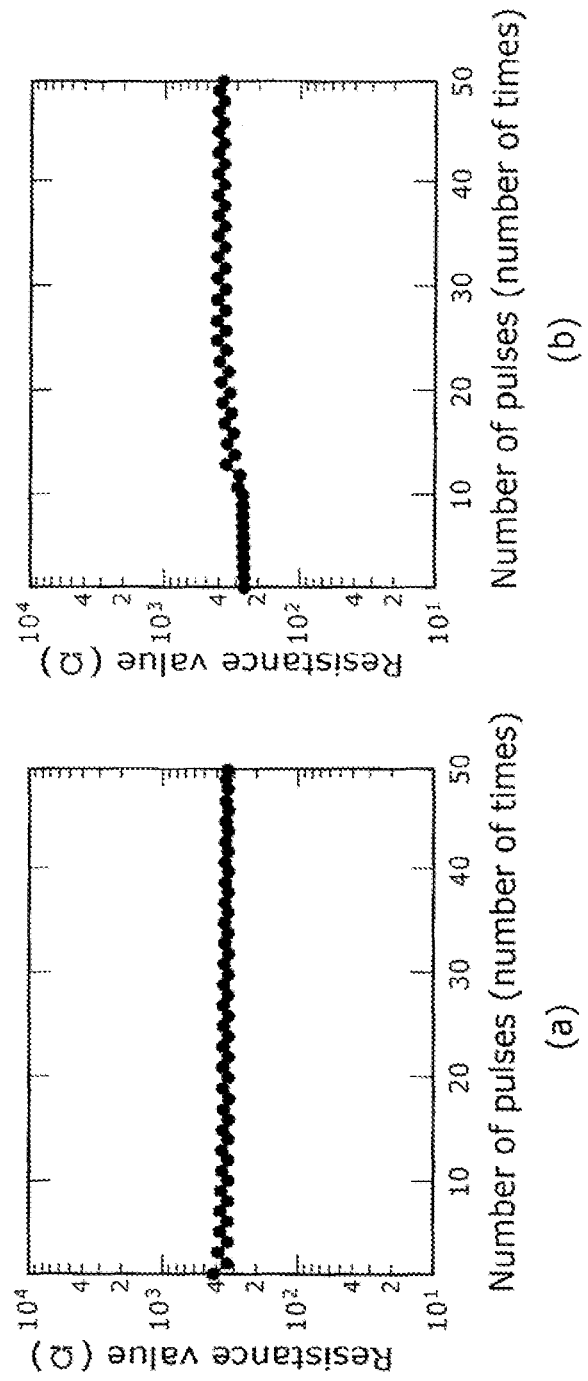
FIGS. 10(a) and 10(b) are diagrams each showing an example of a relationship between a resistance value of the nonvolatile storage element and the number of applied electrical pulses as basic data of the present invention.

In addition, FIG. 10(a) shows resistance change characteristics of an element E in which TaN is used for both the lower electrode 503 and the upper electrode 505. FIG. 10(a) shows a measurement result when an electrical pulse of +7V and an electrical pulse of −5V are applied to the upper electrode 505, and FIG. 10(b) shows a measurement result when an electrical pulse of +5V and an electrical pulse of −7V are applied to the upper electrode 505. In this case also, it may be said that the resistance change occurs to an extent that the change hardly occurs.

As stated above, there are materials that are not prone to cause a resistance change, other than W.

(Variable Resistance Characteristics of Variable Resistance Element in which W and Pt are Used for Electrode)

Next, the following describes resistance change characteristics of an element F that is a variable resistance element in which an oxygen-deficient tantalum oxide layer is located between Pt and W, Pt being a material that is prone to cause a resistance change and W being a material that is not prone to cause the resistance change and has process stability.

The prepared element is formed by using a W thin film as the lower electrode 503 and a Pt thin film as the upper electrode 505. The W thin film and the Pt thin film each are deposited by sputtering a W target and a Pt target in an Ar gas.

Figure 11:
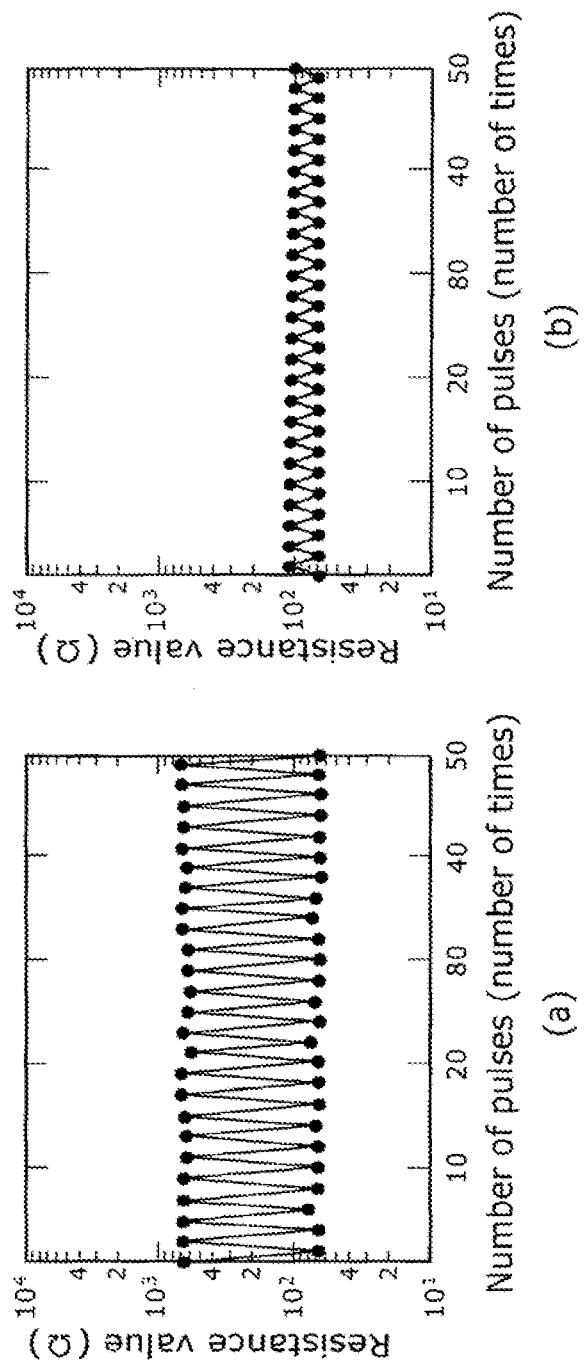
FIGS. 11(a) and 11(b) are diagrams each showing an example of a relationship between a resistance value of the nonvolatile storage element and the number of applied electrical pulses as basic data of the present invention.

FIGS. 11(a) and 11(b) each show a situation of a resistance change of the element F formed in the above manner, which is caused by an electrical pulse.

FIG. 11(a) show a change in a resistance value when +2.5V and −1.5V are alternately applied to the upper electrode 505 with reference to the lower electrode 503 in order to cause a resistance change in the vicinity of the upper electrode 505 (B mode). In this case, the resistance value is approximately 600Ω when the electric pulse of +2.5V is applied, and stably changes to 60Ω when the electric pulse of −1.5V is applied.

On the other hand, FIG. 11(b) shows a change in a resistance value when +1.5V and −2.5V are alternately applied to the upper electrode 505 with reference to the lower electrode 503 in order to cause a resistance change in the vicinity of the lower electrode 503 (A mode). In this case, the resistance change only occurs between 60Ω and 100Ω, and the occurring resistance change is negligible compared with the resistance change that occurs when the voltage for causing the resistance change in the B mode is applied.

The above results in FIGS. 11(a) and 11(b) show that the element F shows ideal operations of a variable resistance nonvolatile storage element which performs a bipolar operation that causes a resistance change only in the vicinity of one of the electrodes.

In addition, a phenomenon in which the A mode and the B mode are kind of blended is not observed.

Figure 12:
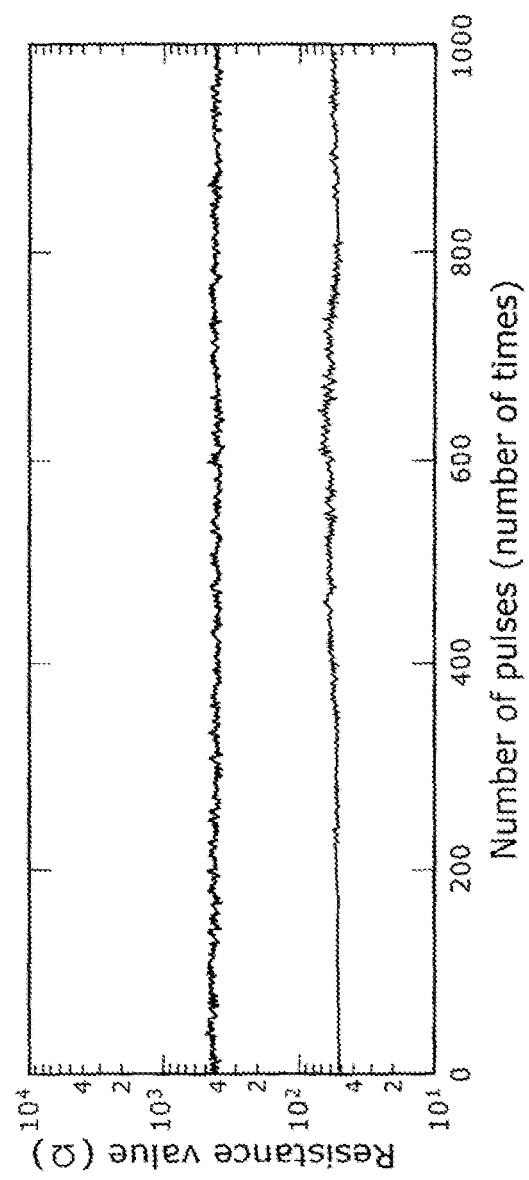
FIG. 12 is a diagram showing an example of a relationship between a resistance value of the nonvolatile storage element and the number of applied electrical pulses as basic data of the present invention.

For instance, although FIG. 12 shows a result of applying an electrical pulse for approximately 1000 times to an element different from the element F from which the measurement results of FIGS. 11(a) and 11(b) (which is another element on the same substrate), it is seen that the resistance change phenomenon occurs very stably.

Based on the above, it has become clear that the variable resistance nonvolatile storage element operates stably because the resistance change can be caused in the intended one of the electrodes by forming the structure of the variable resistance nonvolatile storage element in which the variable resistance layer is located between the electrode that is prone to cause the resistance change phenomenon and the electrode that is not prone to cause the same, and that the variable resistance nonvolatile storage element indicating a desirable bipolar operation can be formed.

In addition, a relationship between an applied voltage and a resistance value shows an operation in which the resistance value increases when an electrical pulse having a positive voltage is applied to the electrode that is prone to cause the resistance change and the resistance value decreases when an electrical pulse having a negative voltage is applied.

(Variable Resistance Characteristics of Variable Resistance Element According to Material Type of Upper Electrode and Lower Electrode)

Next, the following shows a result of the second experiment in which elements each having a different electrode material are evaluated for a tendency for a resistance change to occur.

The following describes, as the results of the second experiment, situations of the resistance changes of the elements in each of which the lower electrode 503 is fixed to W and the upper electrode 505 is made of a different material other than Pt. Here, reasons why the lower electrode 503 is fixed to W are that W is a relatively stable material and that W can be relatively easily processed.

It is to be noted that a method of forming the element is same as the method described in the first experiment, and the lower electrode 503 and the upper electrode 505 are all formed by the sputtering method. In addition, an oxygen-deficient tantalum oxide, a variable resistance material, is formed by sputtering a tantalum metal in $O_2$ and Ar.

Composition of the oxygen-deficient tantalum oxide is set identical in order to examine resistance change characteristics according to a difference between electrodes. In other words, an oxygen content percentage of the oxygen-deficient tantalum oxide is fixed to approximately 58 at % (when expressed as $TaO_x$, x is 1.38).

Furthermore, because the lower electrode 503 is made of W, a non-influential material, in the second experiment, a result of the A mode (the mode in which the high resistance change occurs when the high voltage is applied to the lower electrode with reference to the upper electrode) in which a change in a resistance value hardly occurs is omitted from a description, and only a result of the B mode (the mode in which the high resistance change occurs when the high voltage is applied to the upper electrode with reference to the lower electrode) is shown. Although there is a slight difference in a voltage of an electrical pulse when the resistance change is caused in the B mode depending on elements, a voltage when the high resistance change is caused ranges from +1.8V to +2.0V, and a voltage when the low resistance change is caused ranges from −1.3V to −1.6V, with the lower electrode being a reference of the voltage.

FIG. 13(a) to 13(h) are summaries of the measurement results.

Figure 13:
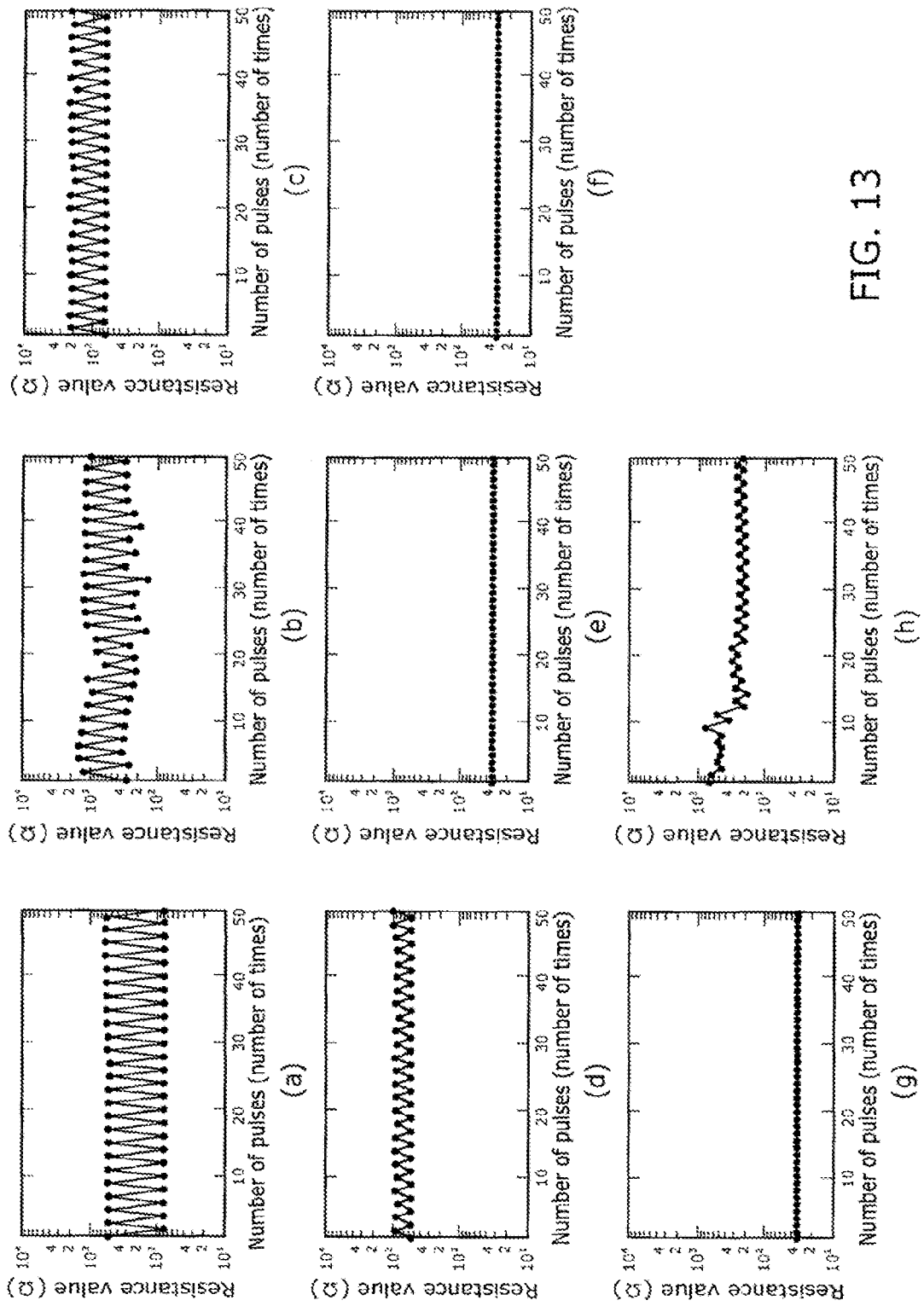
FIG. 13(a) to 13(h) are diagrams each showing an example of a relationship between a resistance value of the nonvolatile storage element and the number of applied electrical pulses as basic data of the present invention.

First, by looking at results of an element G of FIG. 13(a) in which Ir is used for an upper electrode, an element H of FIG. 13(b) in which Ag (silver) is used for an upper electrode, and an element I of FIG. 13(c) in which Cu (copper) is used for an upper electrode, it is clear that the resistance change occurs in a relatively stable and large varying degree. Next, although a slight resistance change is observed in an element J of FIG. 13(d) in which Ni (nickel) is used for an upper electrode and an element N of FIG. 13(h) in which TaN is used for an upper electrode, a variation range of the resistance change is small.

Next, no resistance change phenomenon is observed in an element K of FIG. 13(e) in which Ta is used for an upper electrode, an element L of FIG. 13(f) in which Ti (titanium) is used for an upper electrode, and an element M in which Al (aluminum) is used for an upper electrode. It is considered that these materials are not inherently prone to cause the resistance change.

As can be seen from the above results, for the nonvolatile storage element for which the oxygen-deficient tantalum oxide is used, there are materials that are prone to cause the resistance change phenomenon (influential materials) and materials that are not prone to cause the resistance change phenomenon (non-influential materials). In the range of the second experiment, the influential electrode materials are Pt, Ir, Ag, and Cu, and the non-influential electrode materials are W, Ni, Ta, Ti, Al, and TaN.

When a variable resistance element having a structure in which an oxygen-deficient tantalum oxide is sandwiched by a combination of these materials is formed, a stable resistance change can be achieved without blending the modes. However, when FIG. 7(a), FIG. 11(b), and FIGS. 13(d) and 13(h) are referred to, the resistance change, though weak, is observed in the electrode made of W, Ni or TaN. Accordingly, when any of these materials is used for one of-electrodes and when, for example, Ta, Ti or Al, the electrode material with which no resistance change is observed in the second experiment, is used for the other electrode, the stable yet weak resistance change can be expected.

The following describes some examinations of a mechanism in which a resistance change itself occurs and a material dependency of a tendency for the resistance change to occur.

Figure 14:
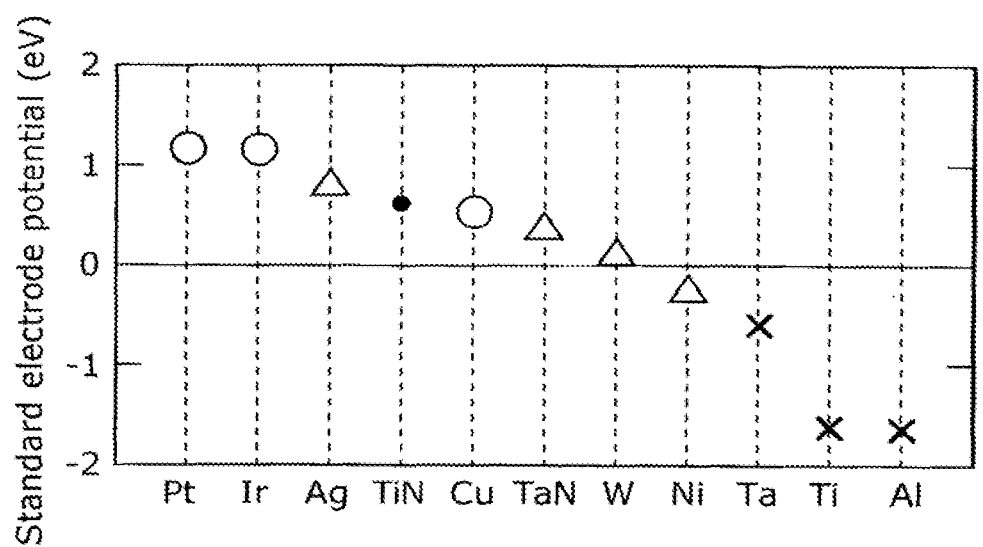
FIG. 14 is a diagram showing a relationship between electrode material of the nonvolatile storage element and a standard electrode potential as basic data of the present invention.

FIG. 14 is a summary of the results of the first and second experiments. The horizontal axis indicates electrode materials, and the vertical axis indicates a standard electrode potential. In FIG. 14, O denotes that the resistance change occurred easily, Δ denotes that the resistance change occurred though a rate of the change was small, and X denotes that the resistance change did not occur. It is to be noted that TiN (titanium nitride) is an electrode material not used in the first and second experiments, and is represented by • for reference.

In FIG. 14, the standard electrode potentials of the electrode materials other than TaN and TiN are the literature values disclosed in Non-patent Reference 1: CRC HANDBOOK of CHEMISTRY and PHYSICS, DAVID R. LIDE Editor-in-chief, 84$^{th}$ Edition 2003-2004, CRC PRESS, and standard electrode potentials of TaN and TiN are data measured by the inventors.

The inventors have measured standard electrode potentials of some electrode materials including TaN and TiN with a 3-electrode system potentiostat including Solartron Electrochemical Measurement System SI1280B. A measurement condition is that an electrode material to be measured is used for an action pole, a Pt electrode is used for an antipole, an Ag/AgCl electrode is used for a reference pole, and 1 wt % KCl 7 ml is used under $N_2$ bubbling for an electrolyte solution.

After a potential at a potential equilibrium point with reference to the electrode material of the Ag/AgCl electrode is measured by searching the potential equilibrium point between the action pole and the antipole under such a condition, a value obtained by adding +0.196V to the measured potential is set to a potential (that is, standard electrode potential) with reference to an electrode material of a standard hydrogen electrode.

According to FIG. 14, it is clear that the resistance change occurs with the material having the standard electrode potential higher than that of Ta, an constituent element of the variable resistance layer, and the resistance change does not occur easily with the material having the standard electrode potential lower than that of Ta. In addition, it is clear that the resistance change occurs more easily as a difference between the standard electrode potentials becomes greater, and the resistance change does not occur more easily as the difference becomes smaller.

Generally, the standard electrode potential is one of indices for susceptibility to oxidation, and denotes that the larger a value of the index is, the less susceptible to oxidation, and the smaller a value of the index is, the more susceptible to oxidation. Based on the above, it is speculated that the susceptibility to oxidation plays a large role in the mechanism of the resistance change phenomenon.

The mechanism of the resistance change is considered based on the above results. First, the following describes a case where an upper electrode is made of a material (material having a large standard electrode potential and not susceptible to oxidation) that is prone to cause the resistance change, using FIGS. 15($a$) and 15($b$).

Figure 15:
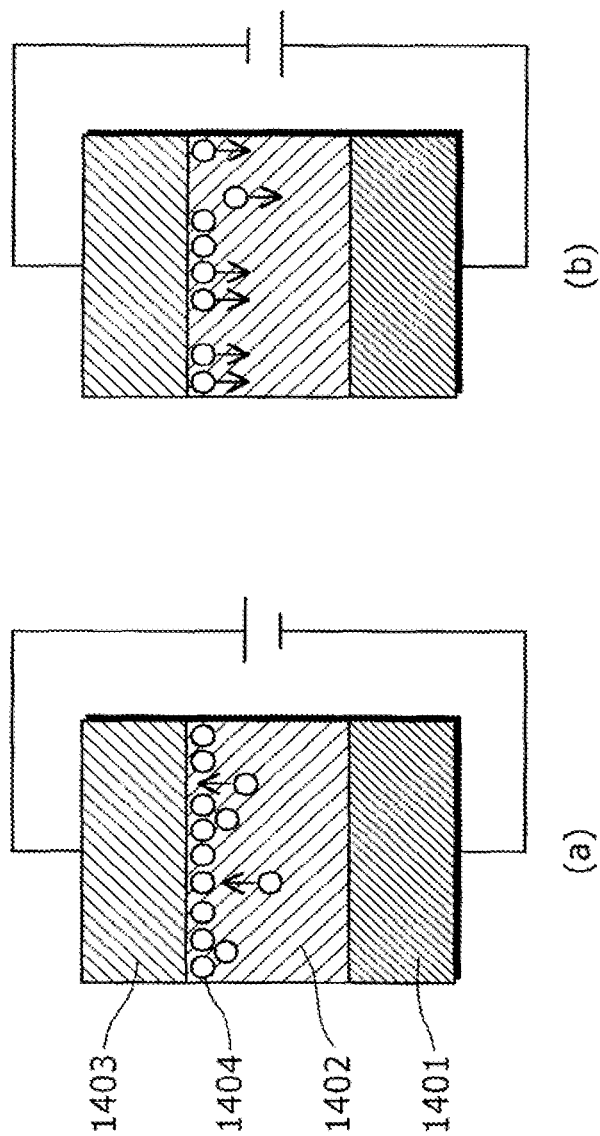
FIGS. 15(a) and 15(b) are cross-sectional schematic diagrams for describing operations of the nonvolatile storage element as basic data of the present invention.

As shown in FIG. 15($a$), in a variable resistance element including a lower electrode 1401, an oxygen-deficient tantalum oxide layer 1402, and an upper electrode 1403 made of a material less susceptible to oxidation than Ta, when a high voltage is applied to the upper electrode 1403 with reference to the lower electrode 1401, oxygen atoms in the oxygen-deficient tantalum oxide become ions, and the ions are moved by an electric field to gather in the vicinity of an interface of the upper electrode 1403.

However, since a metal making up the upper electrode 1403 is not susceptible to oxidation in comparison with Ta, oxygen ions 1404 are accumulated in an interface between the oxygen-deficient tantalum oxide layer 1402 and the upper electrode 1403, and are combined with Ta near the interface to form an oxygen-deficient tantalum oxide having a high oxygen concentration. This increases a resistance of the element.

Next, as shown in FIG. 15($b$), when a high voltage is applied to the lower electrode 1401, oxygen atoms become oxygen ions again, and return to the inside of the oxygen-deficient tantalum oxide layer 1402. With this, it is considered that the low resistance change has occurred.

Figures describing a case where an upper electrode is made of a material more susceptible to oxidation than Ta are FIGS. 16($a$) and 16($b$).

As shown in FIG. 16($a$), in a variable resistance element including a lower electrode 1501, an oxygen-deficient tantalum oxide layer 1502, and an upper electrode 1503 made of a material more susceptible to oxidation than Ta, when the high voltage is applied to the upper electrode 1503 with reference to the lower electrode 1501, oxygen atoms in the oxygen-deficient tantalum oxide become ions, and the ions are moved by an electric field to gather in the vicinity of an interface of the upper electrode 1503.

In this case, since the upper electrode 1503 is more susceptible to oxidation, oxygen ions 1504 are absorbed into the inside of the upper electrode 1503 to be bonded with the material making up the upper electrode 1503. In this case, unlike FIG. 15($a$), a high resistance layer is not formed in the interface between the oxygen-deficient tantalum oxide layer 1502 and the upper electrode 1503, and further a resistance value hardly increases since the number of oxygen ions is fewer with reference to the number of elements making up the upper electrode 1503.

Conversely, as shown in FIG. 16($a$), when the high voltage is applied to the lower electrode 1501, since the oxygen ions absorbed by the upper electrode 1503 are stably bonded with the upper electrode material, it is considered that the oxygen atoms do not easily return into the oxygen-deficient tantalum oxide layer 1502, and a resistance value does not change significantly.

When the material making up the upper electrode is approximately as susceptible to oxidation as Ta in FIGS. 15($a$), 15($b$), 16($a$), and 16($b$), it is considered that a change intermediate between the two above examples occurs, and a weak resistance change occurs.

As can be seen from the above results, in the nonvolatile storage element in which the oxygen-deficient tantalum oxide is used for the variable resistance layer, the materials each having the different standard electrode potentials may be respectively used for the upper electrode and the lower electrode.

With this, the resistance change dominantly occurs in the vicinity of one of the electrodes, which enables an ideal bipolar resistance change to be realized. Further, the resistance modes are not blended, which enables a stable resistance change operation.

More preferably, a material having a standard electrode potential higher than that of Ta and a large difference between the standard electrode potentials may be used for one of electrodes, and a material having a standard electrode potential higher than that of Ta and a small difference between the standard electrode potentials may be used for the other electrode.

Still more preferably, a material having a standard electrode potential higher than that of Ta may be used for one of the electrodes, and a material having a standard electrode potential lower than that of Ta may be used for the other electrode.

It is to be noted that, though not being described as the result of the second experiment, a good experimental result indicating that a stable resistance change phenomenon has occurred is obtained regarding a variable resistance element in which TaN and Pt are respectively used for a lower electrode and an upper electrode.

The standard electrode potential of TaN is +0.48 eV according to the measurement of the inventors, and the standard electrode potentials of Pt and Ta are +1.18 eV and −0.6 eV, respectively, according to Non-patent Reference 1.

This example is an example where Pt, a material having a standard electrode potential higher than that of Ta and a large difference between the standard electrode potentials, is used for the upper electrode, and TaN, a material having a standard electrode potential higher than that of Ta and a small difference between the standard electrode potentials, is used for the lower electrode.

In other words, it is considered that an advantageous effect described as the results of the second experiment is obtained in this example by using, as electrode materials, TaN and Pt that satisfy a condition concerning the above standard electrode potentials.

As for another example, TiN and Pt may be used for a lower electrode and an upper electrode, respectively. The standard electrode potential of TiN is +0.55 eV according to the above measurement of the inventors. Thus, since a combination of TiN and Pt satisfies a condition concerning a standard electrode potential when a tantalum oxide is used for a variable resistance layer, the advantageous effect described as the results of the second experiment can be expected by using TiN and Pt as the electrode materials.

As for still another example, Au (gold) or Pd may be used as the electrode material. The standard electrode potentials of Au and Pd are +1.692 eV and +0.951 eV, respectively, according to Non-patent Reference 1, and are higher than that of Ta which is −0.6 eV. Thus, when the tantalum oxide is used for the variable resistance layer, the advantageous effect described as the results of the second experiment can be expected by using one of Au and Pd as the electrode material that is prone to cause the resistance change and a material (for instance, W having a standard electrode potential of +0.1 eV) having a standard electrode potential lower than that of the other one of Au and Pd as the electrode material that is not prone to cause the resistance change.

In addition, as can be seen from the above mechanism, shown is the operation in which the resistance value increases when the electrical pulse having the positive voltage is applied to the electrode that is prone to cause the resistance change and the resistance value decreases when the electrical pulse having the negative voltage is applied.

(Variable Resistance Element in which Oxygen-Deficient Hafnium Oxide is Used for Variable Resistance Layer)

Next, the following describes, as other similar example, the third experiment regarding a nonvolatile storage element in which an oxygen-deficient hafnium oxide is used for a variable resistance layer and which performs a bipolar operation.

In the same manner as the description of the first experiment, first, a method of forming an oxygen-deficient hafnium oxide layer and a preferred range of an oxygen content percentage are described.

Then, described is a result of forming a structure in which an $HfO_x$ layer is sandwiched by electrodes made of Al, Ti, Ta, W, Cu or Pt and of examining a situation of a resistance change phenomenon caused by an electrical pulse, in order to verify whether or not a tendency for a resistance change to occur depends on electrode materials. Lastly, described is a measurement result of a resistance change of a variable resistance element structured by locating an oxygen-deficient hafnium oxide layer between an influential electrode material and a non-influential electrode material.

(Relationship Between Oxygen Flow Ratio at Time of Sputtering and Oxygen Content Percentage of Hafnium Oxide Layer)

First, the following describes an analysis result of forming conditions and an oxygen content percentage of an oxygen-deficient hafnium oxide layer in the third experiment.

The oxygen-deficient hafnium oxide layer is formed by sputtering an Hf (hafnium) target in Ar gas and $O_2$ gas atmosphere, that is, reactive sputtering. A specific method of forming the oxygen-deficient hafnium oxide layer in the third experiment is as follows.

A substrate is initially placed in a sputtering apparatus, and inside the sputtering apparatus is vacuumed to almost $3\times10^{-5}$ Pa. Sputtering is performed with Hf used as a target, power set to 300 W, a total gas pressure of the Ar gas and the $O_2$ gas set to 0.9 Pa, and a preset temperature of the substrate set to 30° C. Here, the flow ratio of the $O_2$ gas to the Ar gas is changed from 2% to 4.2%.

First, because of the purpose of examining a composition, silicon on which 200 nm of $SiO_2$ is deposited is used as the substrate, and a sputtering time period is adjusted so that a film thickness of the hafnium oxide layer is approximately 50 nm.

Figure 17:
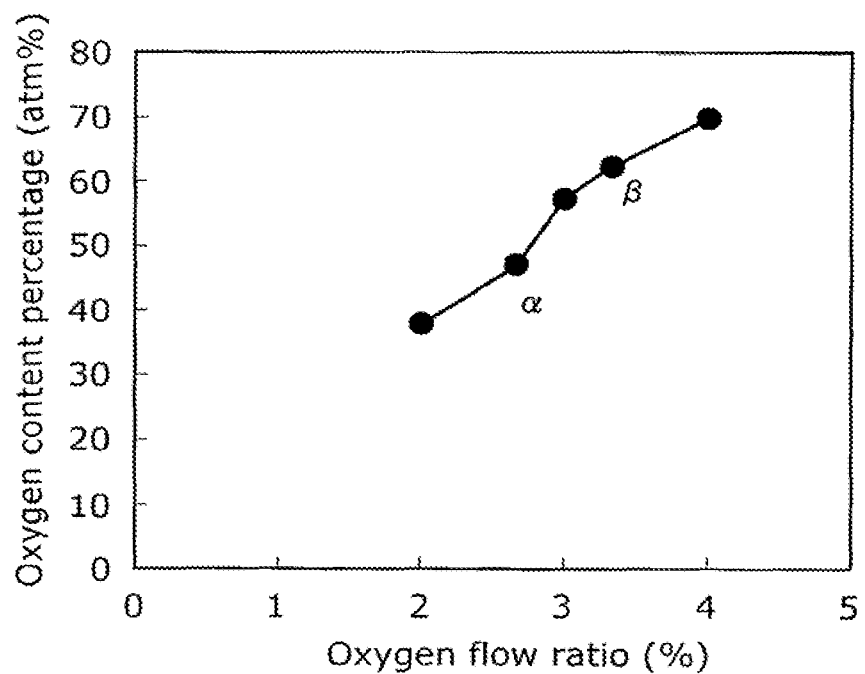
FIG. 17 is a diagram showing an analysis result of a composition of a hafnium oxide layer of the nonvolatile storage element as basic data of the present invention.

FIG. 17 shows a result of analyzing, with the Rutherford Backscattering Spectrometry (RBS), the composition of the hafnium oxide layer formed in the above manner.

The figure shows that an oxygen content percentage of the hafnium oxide layer is changed from approximately 37.7 at % ($HfO_{0.6}$) to approximately 69.4 at % ($HfO_{2.3}$) when an oxygen partial pressure ratio is changed from 2% to 4.2%.

Based on the above result, the following has been clarified: it is possible to control the oxygen content percentage of the hafnium oxide layer with the oxygen flow ratio; and from the oxygen-deficient hafnium oxide layer, in which oxygen is more deficient than oxygen content percentage 66.7 at % of $HfO_2$ that is a stoichiometric oxide of Hf, to even a hafnium oxide layer considered to include excessive oxygen are formed.

It is to be noted that although the Rutherford Backscattering Spectrometry (RBS) is employed in analyzing the hafnium oxide layer, it is also possible to employ an apparatus analytical method such as the Auger Electron Spectroscopy (AES), the X-ray Photoelectron Spectroscopy (XPS), and the Electron Probe Microanalysis (EPMA).

(Resistance Change Characteristics of Oxygen-Deficient Hafnium Oxide Layer)

It is examined which oxygen-deficient hafnium oxide layer having how much oxygen content percentage among the oxygen-deficient hafnium oxide layers formed in the above manner shows a resistance change. Here, Pt is used as an electrode material for both an upper electrode and a lower electrode between which an oxygen-deficient hafnium oxide layer is located.

Using Pt is for the upper electrode and the lower electrode, as stated above, is inappropriate for a bipolar variable resistance nonvolatile element. However, as will be described, Pt is an electrode material which easily shows a resistance change, and is the most suitable material for determining whether or not an oxygen-deficient hafnium oxide layer having a certain oxygen content percentage shows the resistance change.

For all of these reasons, the nonvolatile storage element as shown in FIG. 5 is formed.

In other words, the oxide layer 502 having the thickness of 200 nm is formed on the single-crystal silicon substrate 501 with the thermal oxidation method, and the Pt thin film having the thickness of 100 nm is formed as the lower electrode 503 on the oxide layer 502 with the sputtering method.

Then, an oxygen-deficient hafnium oxide layer 504 is formed with reactive sputtering, with Hf used as a target. In the range examined in the third experiment, the nonvolatile storage element is formed by changing an $O_2$ gas flow ratio from 2% to 4.2% in the same manner as the above analysis sample. A film thickness of the oxygen-deficient hafnium oxide layer 504 is 30 nm.

Then, a Pt thin film having a thickness of 150 nm is deposited as the upper electrode 505 on the oxygen-deficient hafnium oxide layer 504 with the sputtering method.

Lastly, the element region 506 is formed by a photolithography process and a dry-etching process. It is to be noted that the element region 506 has a circular pattern having a diameter of 3 μm.

A resistance change phenomenon of the nonvolatile storage element formed in the above manner is measured. As a result, it is satisfactory that a high resistance value is more than four times as large as a low resistance value in the nonvolatile storage element for which a hafnium oxide film represented by from point α (an oxygen flow ratio of approximately 2.7% and an oxygen content percentage of approximately 46.6 at %) to point β (an oxygen flow ratio of approximately 3.3% and an oxygen content percentage of approximately 62 at %) shown in FIG. 17 is used.

FIGS. 18(a) and 18(b) each show a result of measuring the resistance change characteristics of the nonvolatile storage element for which the hafnium oxide layer having the oxygen content percentage represented by either the point α or the point β is used with reference to the number of applied pulses.

FIGS. 18(a) and 18(b) each show that it is satisfactory that the high resistance value is more than four times as large as the low resistance value in the element for which the hafnium oxide layer having the oxygen content percentage represented by either the point α or the point β is used.

Thus, it can be said that a composition range in which the oxygen content percentage is 46.6 to 62 at %, that is, a range of x, $0.9 \leq x \leq 1.6$, when the variable resistance layer is shown as $HfO_x$, is a more appropriate range of the variable resistance layer (the oxygen content percentage=46.6 at % and the oxygen content percentage=62 at % correspond to x=0.9 and x=1.6, respectively).

(Resistance Change Characteristics of Variable Resistance Element According to Material Type of Upper Electrode and Lower Electrode)

Next, the following describes a result of forming different types of elements in each of which the oxygen-deficient hafnium oxide layer 504 is located between the lower electrode 503 made of W and the upper electrode 505 made of one of Al, Ti, Hf, Ta, W, Cu, and Pt, and of examining a situation of a resistance change caused by an electrical pulse, in order to verify whether or not a tendency for the resistance change to occur depends on electrode materials.

The oxygen content percentage of the used oxygen-deficient hafnium oxide is 61 at % $HfO_{1.56}$) that is close to the upper limit of the preferred range of the oxygen content percentage. Although the method of forming an element is almost same as a method of depositing a hafnium oxide, Al, Ti, Hf, Ta, W, Cu, and Pt are released into an atmosphere after the hafnium oxide layer is formed and are then deposited by another sputtering apparatus with the sputtering method.

Table 2 shows materials of the lower electrode and the upper electrode used for formed elements O to U.

TABLE 2

| Name of Element | Lower Electrode Material | Upper Electrode Material |
|---|---|---|
| O | W | Al |
| P | W | Ti |
| Q | W | Hf |

TABLE 2-continued

| Name of Element | Lower Electrode Material | Upper Electrode Material |
|---|---|---|
| R | W | Ta |
| S | W | W |
| T | W | Cu |
| U | W | Pt |

A resistance of each of the above elements O to U is changed by giving an electrical pulse having a pulse width of 100 nsec at a predetermined amplitude.

In the third experiment, because the lower electrode 503 is made of W, a non-influential material, a result of the A mode (the mode in which the high resistance change occurs when the high voltage is applied to the lower electrode with reference to the upper electrode) is omitted from a description, and only a result of the B mode (the mode in which the high resistance change occurs when the high voltage is applied to the upper electrode with reference to the lower electrode) is shown.

Although there is a slight difference in a voltage of the electrical pulse when the resistance change is caused in the B mode depending on the elements, a voltage when the high resistance change is caused ranges from +1.1V to +1.9V, and a voltage when the low resistance change is caused ranges from −1.1V to −1.5V, with the lower electrode being a reference of the voltage.

FIG. 19(a) to 19(g) are summaries of the measurement results.

Figure 19:
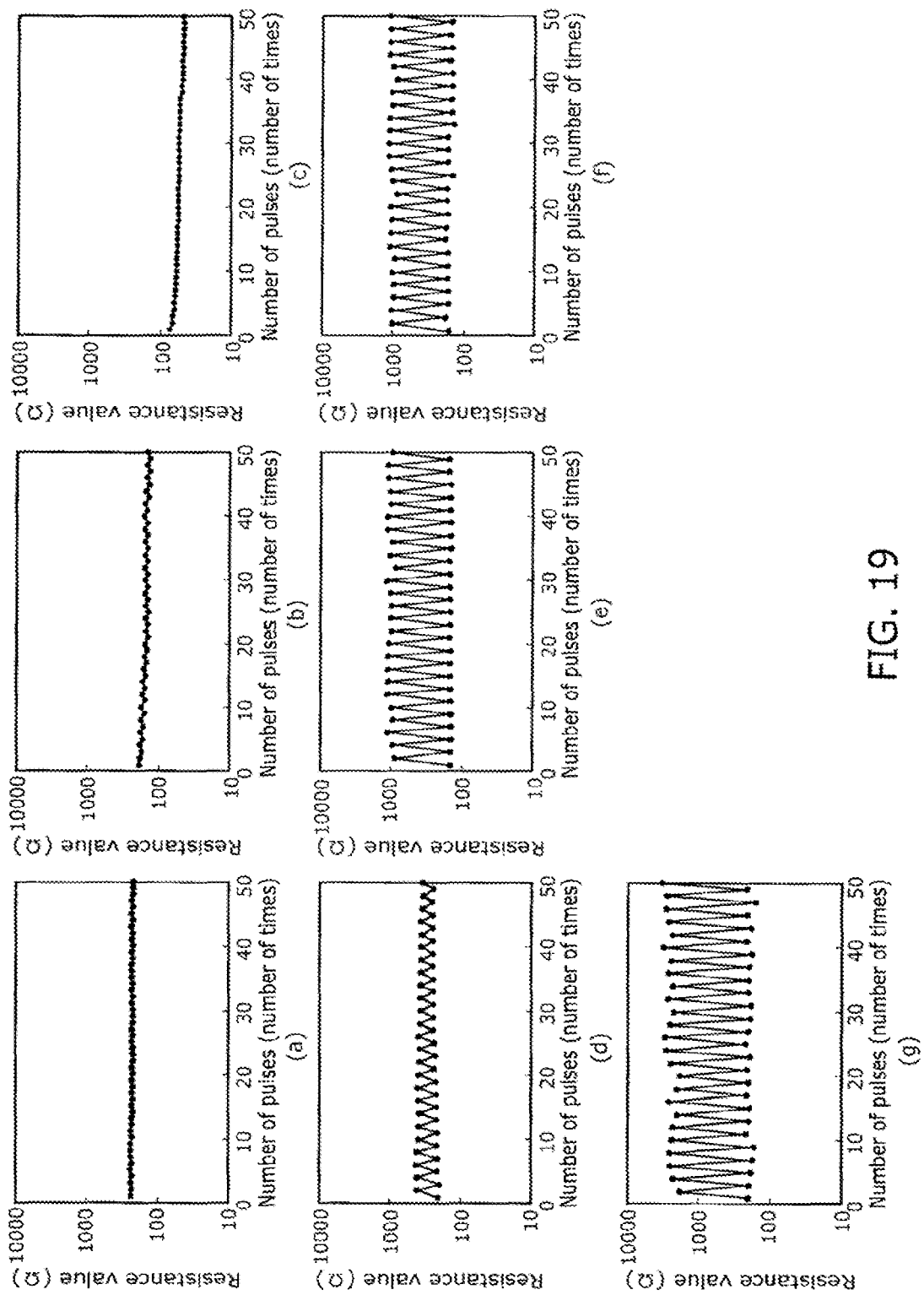
FIG. 19(a) to 19(g) are diagrams each showing an example of a relationship between a resistance value of the nonvolatile storage element and the number of applied electrical pulses as basic data of the present invention.

First, by looking at results of the element O of FIG. 19(a) in which Al is used for the upper electrode, the element P of FIG. 19(b) in which Ti is used for the upper electrode, and the element Q of FIG. 19(c) in which Hf is used for the upper electrode, it is clear that the resistance change hardly occurs or does not occur at all. Next, the resistance change, though slight, is initially observed in the element R of FIG. 19(d) in which Ta is used for the upper electrode, but a variation range of the resistance change decreases as the number of pulses decreases, and then the resistance change is hardly observed. It is considered that these materials are not inherently prone to the resistance change.

Next, a relatively stable resistance change has occurred in the element S of FIG. 19(e) in which W is used for the upper electrode, the element T of FIG. 19(f) in which Cu is used for the upper electrode, and the element U in which Pt is used for the upper electrode.

As can be seen from the above results, for the nonvolatile storage element for which the oxygen-deficient hafnium oxide is used, there are (influential) materials that are prone to cause the resistance change phenomenon and (non-influential) materials that are not prone to cause the resistance change phenomenon. In the range of the third experiment, the influential electrode materials are Pt, Cu, and W, and the non-influential electrode materials are Ta, Hf, Ti, and Al.

When a variable resistance element having a structure in which an oxygen-deficient hafnium oxide is sandwiched by a combination of these materials is formed, a stable resistance change can be achieved without blending the modes. However, when FIG. 19(d) is referred to, the resistance change, though weak, is observed in the electrode made of Ta. Accordingly, when this material is used for one of electrodes and when, for example, Ti or Hf, the electrode material with which no resistance change is observed in the third experiment, is used for the other electrode, the stable yet weak resistance change can be expected.

The following describes some examinations of a mechanism in which a resistance change itself occurs and a material dependency of a tendency for the resistance change to occur.

Figure 20:
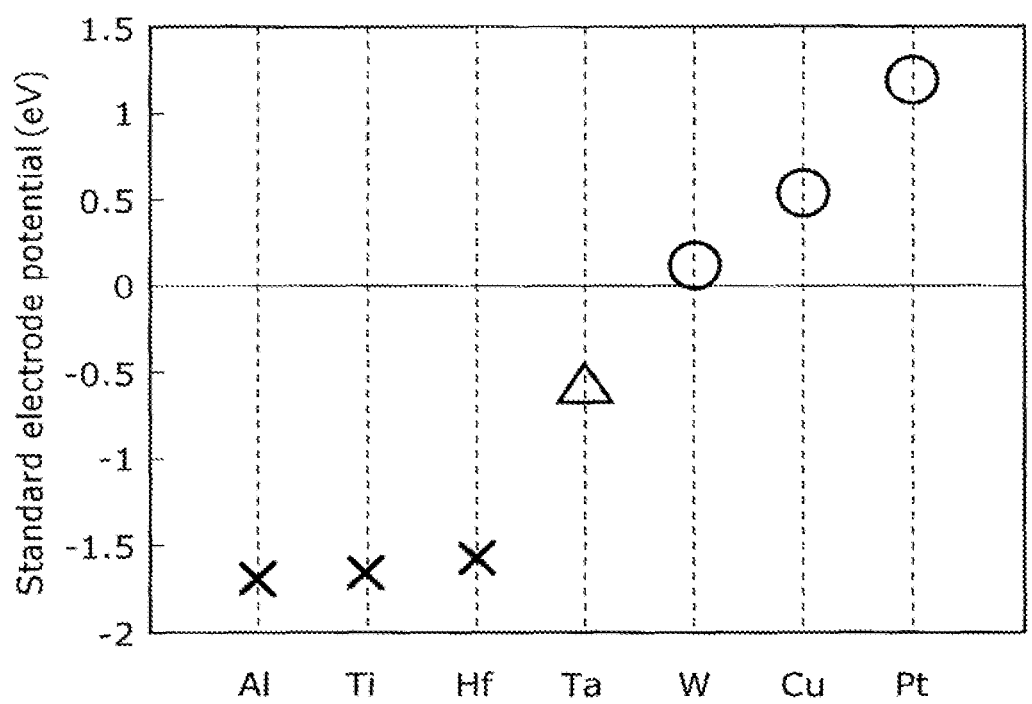
FIG. 20 is a diagram showing a relationship between electrode material types of the nonvolatile storage element and a standard electrode potential as basic data of the present invention.

FIG. 20 is a summary of results associated with the nonvolatile storage element for which the oxygen-deficient hafnium oxide is used. The horizontal axis indicates electrode materials, and the vertical axis indicates a standard electrode potential. In FIG. 20, O denotes that the resistance change occurred easily, Δ denotes that the resistance change occurred though a rate of the change was small, and X denotes that the resistance change did not occur.

According to FIG. 20, it is clear that the resistance change occurs with the materials each having a standard electrode potential higher than that of Hf, a constituent element of the variable resistance layer, and the resistance change does not occur easily with the materials each having a standard electrode potential lower than that of Hf. In addition, it is clear that the resistance change occurs more easily as a difference between the standard electrode potentials becomes greater, and the resistance change does not occur more easily as the difference becomes smaller.

This result indicates the same tendency as in the result which is described with reference to the second experiment and associated with the nonvolatile storage element for which the oxygen-deficient tantalum oxide is used. To put it differently, it is considered that the resistance change mechanism (refer to FIGS. 15(a), 15(b), 16(a) and 16(b)), which is described regarding the nonvolatile storage element for which the oxygen-deficient tantalum oxide is used, functions, in the same manner, in the nonvolatile storage element for which the oxygen-deficient hafnium oxide is used.

As can be seen from the above results, in the nonvolatile storage element in which the oxygen-deficient hafnium oxide is used for the variable resistance layer, the materials each having the different standard electrode potential may be used for the upper electrode and the lower electrode, respectively.

With this, the resistance change dominantly occurs in the vicinity of one of the electrodes, which enables an ideal bipolar resistance change to be realized. Further, the resistance modes are not blended, which enables a stable resistance change operation.

More preferably, a material having a standard electrode potential higher than that of Hf and a large difference between the standard electrode potentials may be used for one of electrodes, and a material having a standard electrode potential higher than that of Hf and a small difference between the standard electrode potentials may be used for the other electrode.

Still more preferably, a material having a standard electrode potential higher than that of Hf may be used for one of the electrodes, and a material having a standard electrode potential equal to or lower than that of Hf may be used for the other electrode.

It is to be noted that, though not being described as the result of the third experiment, according to Non-patent Reference 1, the standard electrode potential of Au is +1.692 eV, which is higher than −1.55 eV that is the standard electrode potential of Hf. Thus, when the Hf oxide is used as the variable resistance layer, the advantageous effect described as the results of the third experiment can be expected even if Au is used as the electrode material that are prone to cause the resistance change.

Furthermore, as described in association with the second experiment, as another example, one of TaN and Tin may be used for the lower electrode, and Pt may be used for the upper electrode. Since, based on a value of the abovementioned standard electrode potential, a combination of these electrode materials satisfies a condition concerning a standard electrode potential when the Hf oxide is used for the variable resistance layer, the advantageous effect described as the results of the third experiment can be expected by using either TaN or TiN, and Pt as the electrode materials.

In addition, as can be seen from the above mechanism, shown is the operation in which the resistance value increases when the electrical pulse having the positive voltage is applied to the electrode that is prone to cause the resistance change and the resistance value decreases when the electrical pulse having the negative voltage is applied.

It is to be noted that although the examples where the oxygen-deficient tantalum oxide or the hafnium oxide is used as the variable resistance layer are described in the first, second, and third experiments, the present invention is not limited to the examples, and since it is considered that an electric field applied to an electrode causes movement of oxygen ions as described above, the present invention can be applied to a nonvolatile storage element in which an oxygen-deficient oxide film of another transition metal is used for a variable resistance layer. In this case, a nonvolatile storage element which operates predominantly with one of electrodes can be formed by selecting an electrode material based on a standard electrode potential of the transition metal material to be used. In addition, a slight amount of dopant may be added to the tantalum oxide or the hafnium oxide which is the variable resistance layer, to an extent that resistance change characteristics are not significantly changed.

(Variable Resistance Nonvolatile Storage Device According to the Embodiment of the Present Invention)

Next, the following describes, as the embodiment of the present invention, a 1T1R nonvolatile storage device for which the abovementioned variable resistance element is used.

(1T1R Nonvolatile Storage Device Having NMOS Structure)

Figure 21:
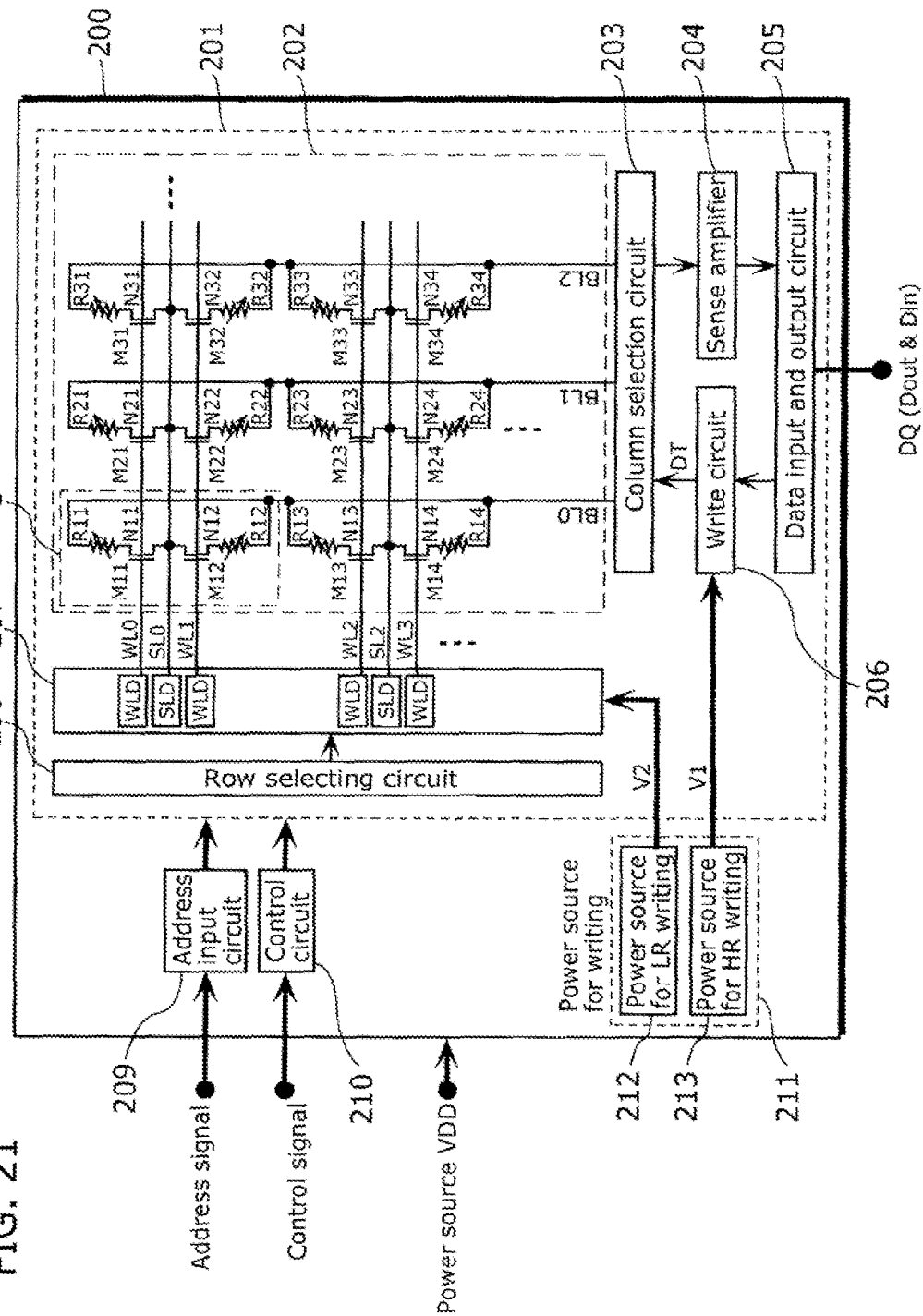
FIG. 21 is a configuration diagram of a variable resistance nonvolatile storage device according to an embodiment of the present invention.

FIG. 21 is a block diagram showing a structure of a nonvolatile storage device according to the embodiment of the present invention.

As shown in FIG. 21, a nonvolatile storage device 200 according to the embodiment includes a memory main portion 201 on a semiconductor substrate, and the memory main portion 201 includes: a memory array 202; a row selection circuit 208; a row driver 207 including a word line driver WLD and a source line driver SLD; a column selection circuit 203; a write circuit 206 for writing data; a sense amplifier 204 which detects an amount of a current flowing in a selected bit line and determines whether stored data indicates "1" or "0"; and a data input and output circuit 205 which performs an input and output process of input and output data via a terminal DQ.

The nonvolatile storage device 200 further includes, as a power source for writing 211, a power source for low resistance (LR) writing 212 and a power source for high resistance (HR) writing 213. An output V2 of the power source for low resistance (LR) writing 212 is supplied to the row driver 207, and an output V1 of the power source for high resistance (HR) writing 213 is supplied to the write circuit 206.

The nonvolatile storage device 200 further includes: an address input circuit 209 which receives an address signal inputted from the outside; and a control circuit 210 which controls operations of the memory main portion 201 based on a control signal inputted from the outside.

The memory array 202 includes: word lines WL0, WL1, WL2 . . . ; bit lines BL0, BL1, BL2 . . . ; NMOS transistors N11, N12, N13, N21, N22, N23, N31, N32, N33 . . . (hereinafter, referred to as "transistors N11, N12 . . . "); variable resistance elements R11, R12, R13, R21, R22, R23, R31, R32, R33 ... (hereinafter, referred to as "variable resistance elements R11, R12 ... "), and each of memory arrays 202 includes memory cells M11, M12, M13, M21, M22, M23, M31, M32, M33 ... (hereinafter, referred to as "memory cells M11, M12 ... "), the word lines and the bit lines being formed above the semiconductor substrate and arranged to intersect with each other, the NMOS transistors being provided at corresponding points where the word lines WL0, WL1, WL2 ... and the bit lines BL0, BL1, B12 ... intersect with each other, and the variable resistance elements being connected in series with the transistors N11, N12 ... on a one-on-one basis. Here, the variable resistance elements R11, R12 ... each are the variable resistance element described above as the basic data of the present invention.

As shown in FIG. 21, gates of the transistors N11, N21, N31 ... are connected to the word line WL0, gates of the transistors N12, N22, N32 ... are connected to the word line WL1, gates of the transistors N13, N23, N33 ... are connected to the word line WL2, and gates of the transistors N14, N24, N34 ... are connected to the word line WL3.

Furthermore, the transistors N11, N21, N31 ... and the transistors N12, N22, N32 ... are commonly connected to the source line L0, and the transistors N13, N23, N33 ... and the transistors N14, N24, N34 ... are commonly connected to the source line SL2.

Moreover, the variable resistance elements R11, R12, R13, R14 ... are connected to the bit line BL0, the variable resistance elements R21, R22, R23, R24 ... are connected to the bit line BL1, and the variable resistance elements R31, R32, R33, R34 ... are connected to the bit line BL2.

The address input circuit 209 receives an address signal from an external circuit (not shown), and simultaneously outputs a row address signal to the row selection circuit 208 and a column address signal to the column selection circuit 203 based on the address signal. Here, the address signal is a signal indicating an address of a specific memory cell selected from among the memory cells M11, M12 ....

In a data write cycle, the control circuit 210 outputs, to the write circuit 206, a write command signal indicating application of a voltage for writing, according to input data Din inputted into the data input and output circuit 205. On the other hand, in a data read cycle, the control circuit 210 outputs, to the sense amplifier 204, a read command signal indicating a read operation.

The row selection circuit 208 receives the row address signal outputted from the address input circuit 209, and causes the word line driver WLD of the row driver 207 to apply a predetermined voltage to the selected word line according to the row address signal, the word line driver WLD corresponding to any one of the word lines WL0, WL1, WL2....

Similarly, the row selection circuit 208 receives the row address signal outputted from the address input circuit 209, and causes the source line driver SLD of the row driver 207 to apply a predetermined voltage to a selected source line according to the row address signal, the source line driver SLD corresponding to any one of the source lines SL0, SL2....

Furthermore, the column selection circuit 203 receives the column address signal outputted from the address input circuit 209, selects any one of the bit lines BL0, BL1, BL2 ... according to the column address signal, and applies the voltage for writing or the voltage for reading to the selected bit line.

When the write circuit 206 receives the write command signal outputted from the control circuit 210, the write circuit 206 outputs, to the column selection circuit 203, a signal indicating the application of the voltage for writing to the selected bit line.

Moreover, in the data read cycle, the sense amplifier 204 detects an amount of a current flowing in the selected bit line to be read, and determines whether stored data indicates "1" or "0". Output data DO obtained as a result of the above is outputted to the external circuit via the data input and output circuit 205.

The power source for writing 211 includes the power source for low resistance (LR) writing 212 and the power source for high resistance (HR) writing 213, and outputs of the power source for low resistance (LR) writing 212 and the power source for high resistance (HR) writing 213 are inputted to the row driver 207 and the write circuit 206, respectively.

Regarding a write operation, the variable resistance element whose upper and lower electrode material types are different and which is described in the embodiment also has hysteretic current-voltage characteristics similar to the hysteretic current-voltage characteristics (FIG. 2) of the variable resistance element in which Pt is used for the upper electrode and the lower electrode.

Figure 2:
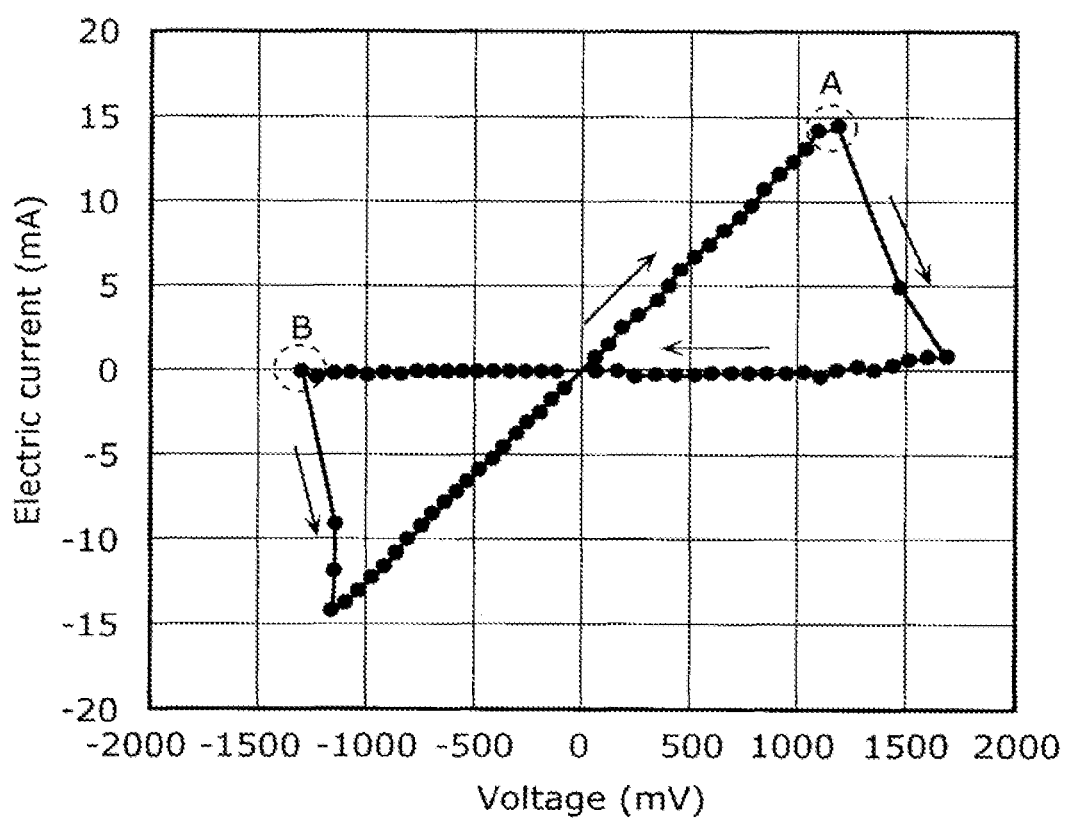
FIG. 2 is a diagram showing an example of hysteretic current-voltage characteristics in a resistance change of the nonvolatile storage element as basic data of the present invention.

In hysteretic current-voltage characteristics of each of the variable resistance elements R11, R12 ..., when a voltage corresponding to the point A of FIG. 2 is denoted as a threshold voltage for high resistance writing $V_{HR}$ and a voltage corresponding to the point B of FIG. 2 is denoted as a threshold voltage for low resistance writing $V_{LR}$, the power source for HR writing 213 is a power circuit capable of applying, to the variable resistance elements R11, R12 ..., a positive voltage higher than the threshold voltage for high resistance writing $V_{HR}$, and the power source for LR writing 212 is a power circuit capable of applying, to the variable resistance elements R11, R12 ..., a negative voltage higher than an absolute value of the threshold voltage for low resistance writing $V_{LR}$.

Figure 22:
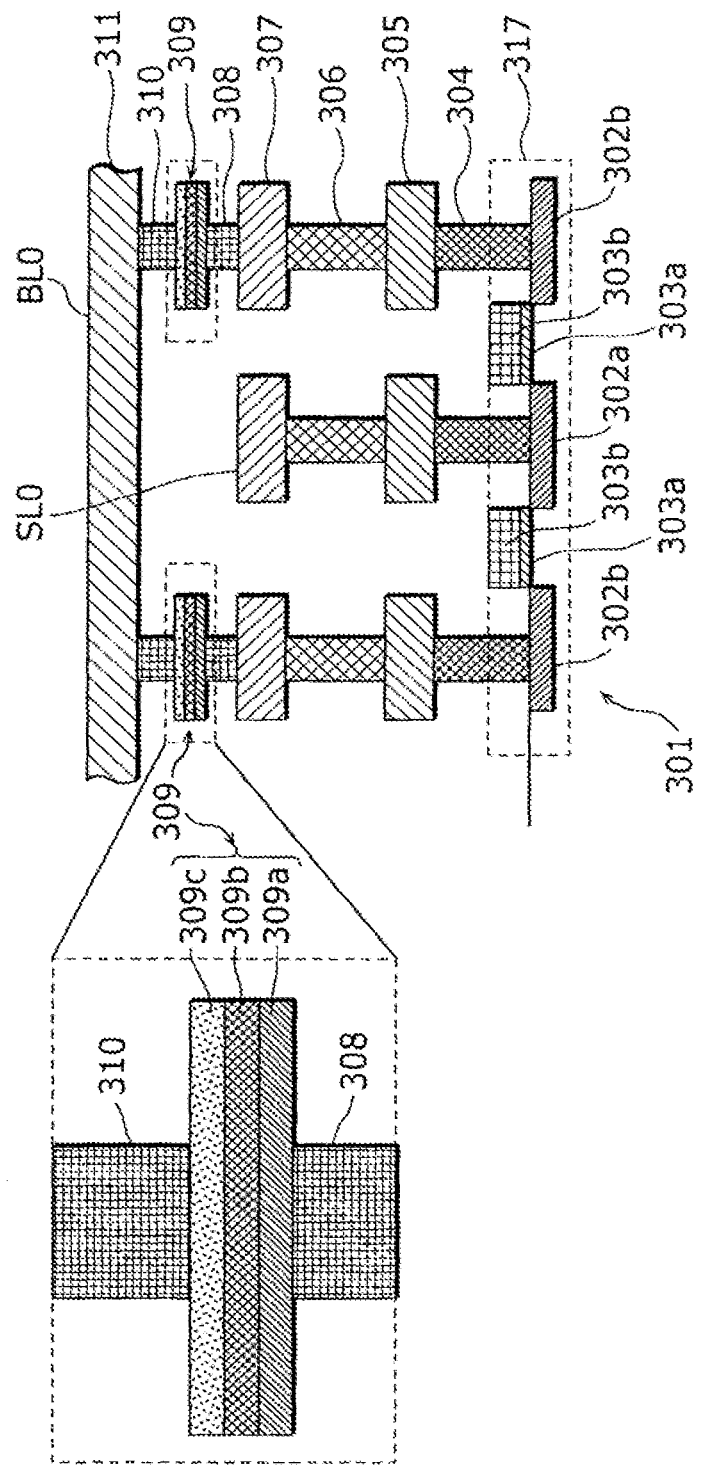
FIG. 22 is a cross-section diagram showing an example of a structure of a memory cell unit of the variable resistance nonvolatile storage device according to the embodiment of the present invention.

FIG. 22 is a cross-section diagram showing a structure (two-bit structure) of a memory cell 300 corresponding to part C in FIG. 21 and an enlarged view of a variable resistance element 309.

A transistor 317 and the variable resistance element 309 correspond to the transistors N11 and N12 and the variable resistance elements R11 and R12 that are shown in FIG. 21, respectively.

The memory cell 300 is structured by sequentially forming, above a semiconductor substrate 301, a second N-type diffusion layer region 302a, a first N-type diffusion layer region 302b, a gate insulator film 303a, a gate electrode 303b, a first via 304, a first wiring layer 305, a second via 306, a second wiring layer 307, a third via 308, the variable resistance element 309, a fourth via 310, and a third wiring layer 311.

The third wiring layer 311 connected to the fourth via 310 corresponds to the bit line BL0, the first and second wiring layers 305 and 307 connected to the second N-type diffusion layer region 302a of the transistor 317 correspond to the source line SL0 extending perpendicular to the figure.

A voltage of the semiconductor substrate 301 is 0V, and is supplied by a commonly-known structure via a 0V power source line (not shown).

As shown by the enlarged portion in FIG. 22, the variable resistance element 309 is formed by locating, on the third via 308, the variable resistance layer 309b between the lower electrode 309a and the upper electrode 309c, and is connected to the fourth via 310 that is further connected to the third wiring layer 311.

Here, the variable resistance layer 309b is made of an oxygen-deficient tantalum oxide, and the lower electrode 309a and the upper electrode 309c are made of different materials. The lower electrode 309a is made of W, the electrode material that is not prone to cause the resistance change, and is connected through the via to the first N-type diffusion layer region 302b of the transistor, and the upper electrode 309c is made of Pt that is prone to cause the resistance change and is structured to be connected through the via to the bit line BL0 formed in the third wiring layer 311.

(Operations of Variable Resistance Nonvolatile Storage Device)

The following describes example operations of the variable resistance nonvolatile storage device structured in the above manner in a write cycle when data is written and in a read cycle when data is read, with reference to timing charts shown in FIG. 23(a) to 23(c).

FIG. 23(a) to 23(c) are timing charts showing the example operations of the nonvolatile storage device according to the embodiment of the present invention. It is to be noted that, here, defined is that a case where the variable resistance layer is in a high resistance state and a case where the variable resistance layer is in a low resistance state are assigned to data "1" and data "0", respectively, and the example operations of each case are described. In addition, the description is only for a case where the data is written and read.

Moreover, in FIG. 23(a), a voltage V2 generated by the power source for LR writing 212 is determined by a voltage value at which the voltage higher than the threshold voltage for low resistance writing $V_{LR}$ is applied to the variable resistance elements R11, R12 . . . .

In FIG. 23(b), a voltage V1 generated by the power source for HR writing 213 is determined by a voltage value at which the voltage higher than the threshold voltage for high resistance writing $V_{HR}$ is applied to the variable resistance elements R11, R12 . . . .

A method of determining V1 and V2 is described later.

In FIG. 23(c), $V_{read}$ is a voltage for reading generated by the sense amplifier 204, and is equal to or lower than the threshold voltage for high resistance writing $V_{HR}$ is applied to the variable resistance elements R11, R12 . . . .

Furthermore, in FIG. 23(a) to 23(c), VDD corresponds to a power supply voltage supplied to the nonvolatile storage device 200.

In the write cycle when the data "0" is written into a memory cell M11 shown in FIG. 23(a), the selected bit line BL0 and the selected source line SL0 are first set to the voltage V2. Next, the word line WL0 to be selected is set to the voltage VDD, and an NMOS transistor N11 of the selected memory cell M11 is turned on. Since the voltage V2 is applied to both the second N-type diffusion layer region 302a and the first N-type diffusion layer region 302b of the transistor 317 at this stage, a current does not flow therein.

Then, the selected bit line BL0 is set to the voltage 0V for a predetermined period, and a pulse waveform to be the voltage V2 is applied again to the bit line BL0 after the predetermined period. At this stage, in the variable resistance element 309, the negative voltage having the absolute value higher than the threshold voltage for low resistance writing $V_{LR}$ is applied to the upper electrode 309c with reference to the lower electrode 309a, and a high resistance value is replaced by writing a low resistance value. Then, the word line WL0 is set to the voltage 0V, the transistor 317 is turned off, and writing of the data "0" is completed.

In the write cycle when the data "1" is written into the memory cell M11 shown in FIG. 23(b), the selected bit line BL0 and the selected source line SL0 are first set to the voltage 0V. Next, the word line WL0 to be selected is set to the voltage VDD, and the NMOS transistor N11 of the memory cell M11 is turned on.

Then, the selected bit line BL0 is set to the voltage V1 for a predetermined period, and a pulse waveform to be the voltage 0V is applied again to the bit line BL0 after the predetermined period. At this stage, in the variable resistance element 309, the positive voltage higher than the threshold voltage for high resistance writing $V_{HR}$ is applied to the upper electrode 309c with reference to the lower electrode 309a, and a low resistance value is replaced by writing a high resistance value. Then, the word line WL0 is set to the voltage 0V, and writing of the data "1" is completed.

In the read cycle when data is read from the memory cell M11 shown in FIG. 23(c), the selected bit line BL0 and the source line SL0 are first set to the voltage 0V. Next, the word line WL0 to be selected is set to the voltage VDD, and the NMOS transistor N11 of the memory cell M11 is turned on.

Then, the selected bit line BL0 is set to the read voltage $V_{read}$ for a predetermined period, and it is determined whether stored data is the data "0" or the data "1" by detecting a current value of a current flowing in the selected memory cell M11. Then, the word line WL0 is set to the voltage 0V, and reading of the data is completed.

(Characteristics of 1T1R Memory Cell)

The following describes the 1T1R memory cells M11, M12 . . . according to the embodiment, especially structures of the NMOS transistors N11, N12 . . . .

According to the present embodiment, as shown by the enlarged portion in FIG. 22, the electrode material that is prone to cause the resistance change in the variable resistance layer 309b is used for the upper electrode 309c, it is considered that the oxidation phenomenon progresses in the vicinity of the interface of the upper electrode 309c by applying the positive voltage to the upper electrode 309c with reference to the lower electrode 309a and the variable resistance element 309 is changed to be in the high resistance state and that a reduction phenomenon progresses by the application of the voltage having a direction opposite to the positive voltage and the variable resistance element 309 is changed to be in the low resistance state, and the situation of the resistance change with reference to the voltage application direction can be limited to one pattern.

Figure 24:
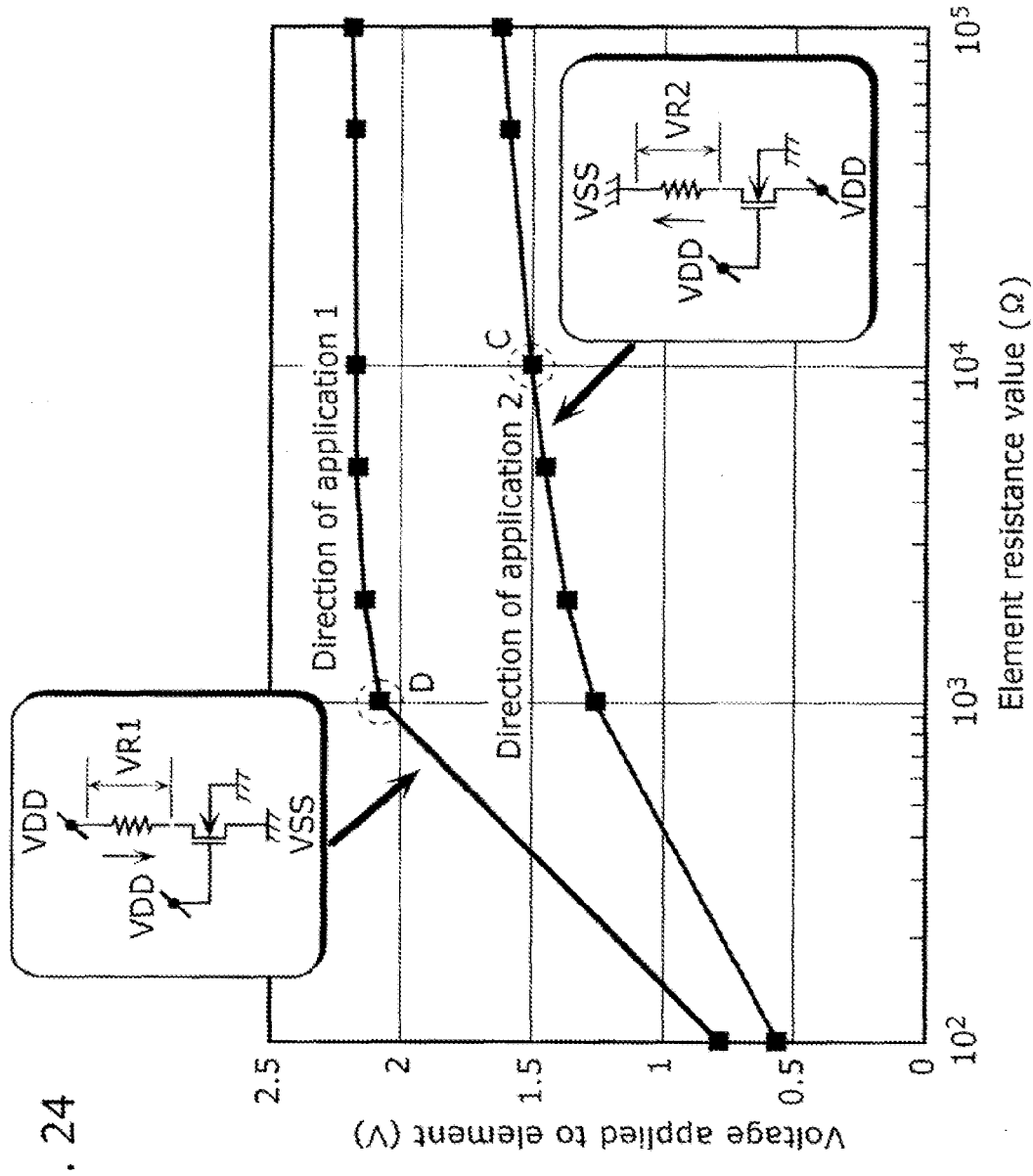
FIG. 24 is a simulation diagram of memory cell characteristics of the variable resistance nonvolatile storage device according to the embodiment of the present invention.

FIG. 24 shows a relationship between a voltage applied to a variable resistance element and a resistance value of the variable resistance element when 2.2V is applied to both ends of a memory cell.

In FIG. 21, an application direction 1 indicates characteristics when a predetermined positive voltage is applied to the bit lines BL0, BL1 . . . and 0V is applied to the source lines SL0, SL1 . . . , that is, when the positive voltage is applied to the upper electrode 309c with reference to the lower electrode 309a.

In addition, in FIG. 21, an application direction 2 indicates characteristics when 0V is applied to the bit lines BL0, BL1 . . . and a predetermined positive voltage is applied to the source lines SL0, SL1 . . . , that is, when the negative voltage is applied to the upper electrode 309c with reference to the lower electrode 309a.

For example, in the case of the application direction 1, when the element resistance value is 1000Ω, it is indicated that approximately 2.1V can be applied to the variable resistance element and that 2.1V/1000Ω=2.1 mA can be driven as a current value. In addition, in the case of the application direction 2, it is indicated that approximately 1.25V can be applied to the variable resistance element and that 1.25V/1000Ω=1.25 mA can be driven as a current value.

As mentioned above, it is clear that, in comparison with the case of the application direction 2, a 1.7 times larger current can be driven in the case of the application direction 1 in which the influence of the substrate bias effect of the NMOS transistor is little.

Figure 23:
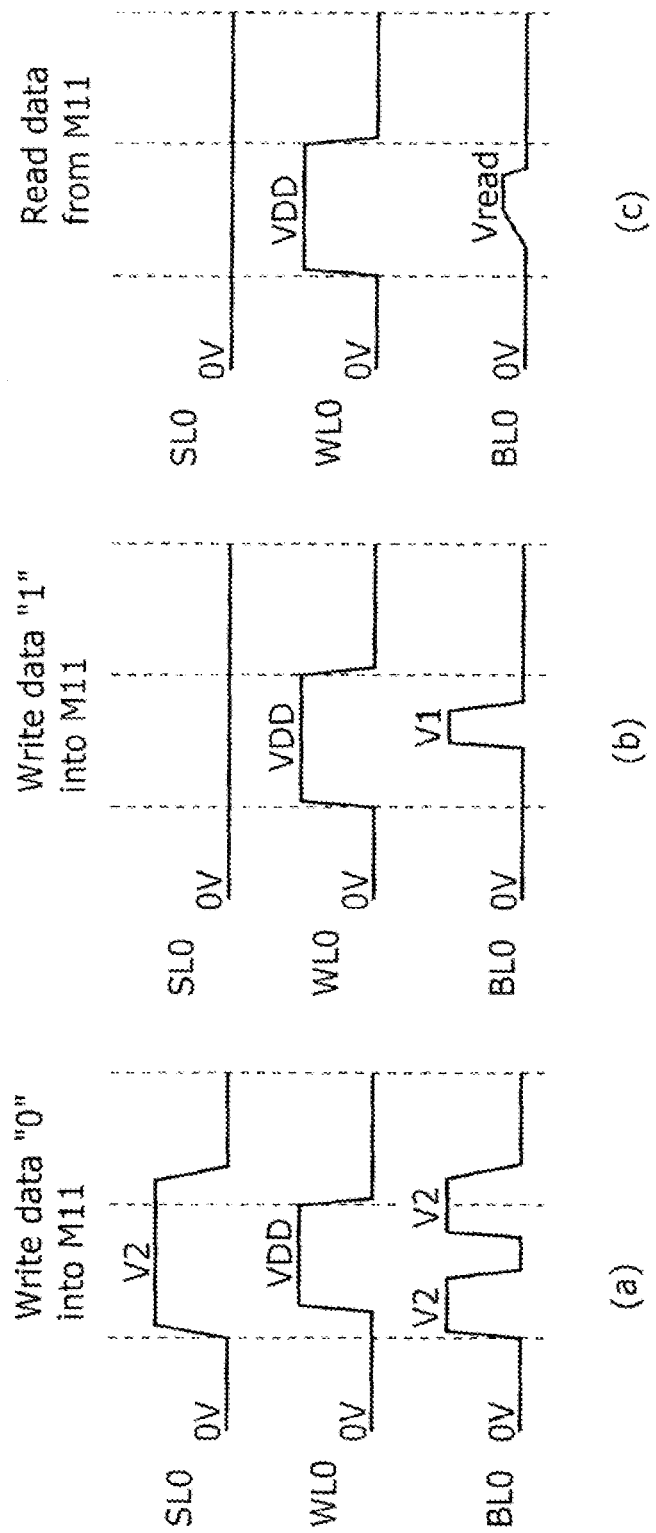
FIG. 23(a) to 23(c) are operation timing charts of the variable resistance nonvolatile storage device according to the embodiment of the present invention.

Furthermore, a value of the voltage V2 generated by the power source for LR writing 212 shown in FIG. 23(*a*) can be determined by using the characteristics indicated by the application direction 2.

For instance, when a resistance value is 10 kΩ in the high resistance state of the variable resistance element 309, it is clear that applying 2.2V to the both ends of the memory cell allows application of up to approximately 1.5V to the variable resistance element 309 (point C in FIG. 24). Here, a current value is determined as 1.5V/10 kΩ=0.15 mA.

When the threshold voltage for low resistance writing $V_{LR}$ of the variable resistance element 309 is, for example, −1.3V, the voltage V2 is set to 2.2V in the power source for LR writing 212, and when there is a current drive capability of 0.15 mA or more, it is clear that a voltage higher than the threshold voltage for low resistance writing $V_{LR}$ can be applied to the variable resistance element 309.

Likewise, a value of the voltage V1 generated by the power source for HR writing 213 shown in FIG. 23(*b*) can be determined by using the characteristics indicated by the application direction 1.

For instance, when a resistance value is 1000Ω in the low resistance state of the variable resistance element 309, it is clear that applying 2.2V to the both ends of the memory cell allows application of up to approximately 2.1V to the variable resistance element 309 (point D in FIG. 24). Here, a current value is determined as 2.1V/1000Ω=2.1 mA.

When the threshold voltage for high resistance writing $V_{HR}$ of the variable resistance element 309 is, for example, 1.2V, the voltage V1 is set to 2.2V in the power source for HR writing 213, and when there is a current drive capability of 2.1 mA or more, it is clear that a voltage higher than the threshold voltage for high resistance writing $V_{HR}$ can be applied to the variable resistance element 309. More preferably, the voltage V1 may be determined to be a lower voltage (for instance, 1.8V) having a voltage value having a margin above a certain level.

Moreover, an approximate voltage is set by the above-mentioned method in a design phase, and a commonly-known conventional method of determining the voltage V1 or the voltage V2 to be an optimum voltage, that is, a voltage with which the resistance change stably occurs, with minor adjustment while checking an operation in a product test phase may be used in combination with the above method.

As described above, since the variable resistance element including the upper electrode made of the electrode material that is prone to cause the resistance change and the lower electrode made of the electrode material that is not prone to cause the resistance change is used for the variable resistance nonvolatile storage device according to the present embodiment, a voltage application direction (driving polarity) which stably causes a resistance change in a direction (low resistance change or high resistance change) is uniquely determined in each of the memory cells.

In addition, since the memory cell is structured by connecting the lower electrode and one N-type diffusion layer region of the NMOS transistor, voltage application for the resistance change from the low resistance to the high resistance can be surely performed in conformance to the application direction 1, it is not necessary to assume the case of the application direction 2, and the memory cell can be designed with the optimum transistor sizes, the resistance change requiring a larger current.

This means that especially the voltage V1 of the power source for HR writing can be further reduced when there is a margin in the current drive capability, and is effective for reduction in voltage and reduction in power consumption.

Further, as the driving polarity is uniquely determined, it is not necessary to manage information identifying a mode of the resistance change characteristics, and a simple and inexpensive circuit configuration can be achieved.

In addition, when an expensive electrode material such as Pt is used, the expensive electrode material needs to be used for only one of the electrodes, which is effective for reduction in manufacturing costs.

(Other Structure Examples of 1T1R Memory Cell)

Figure 25:
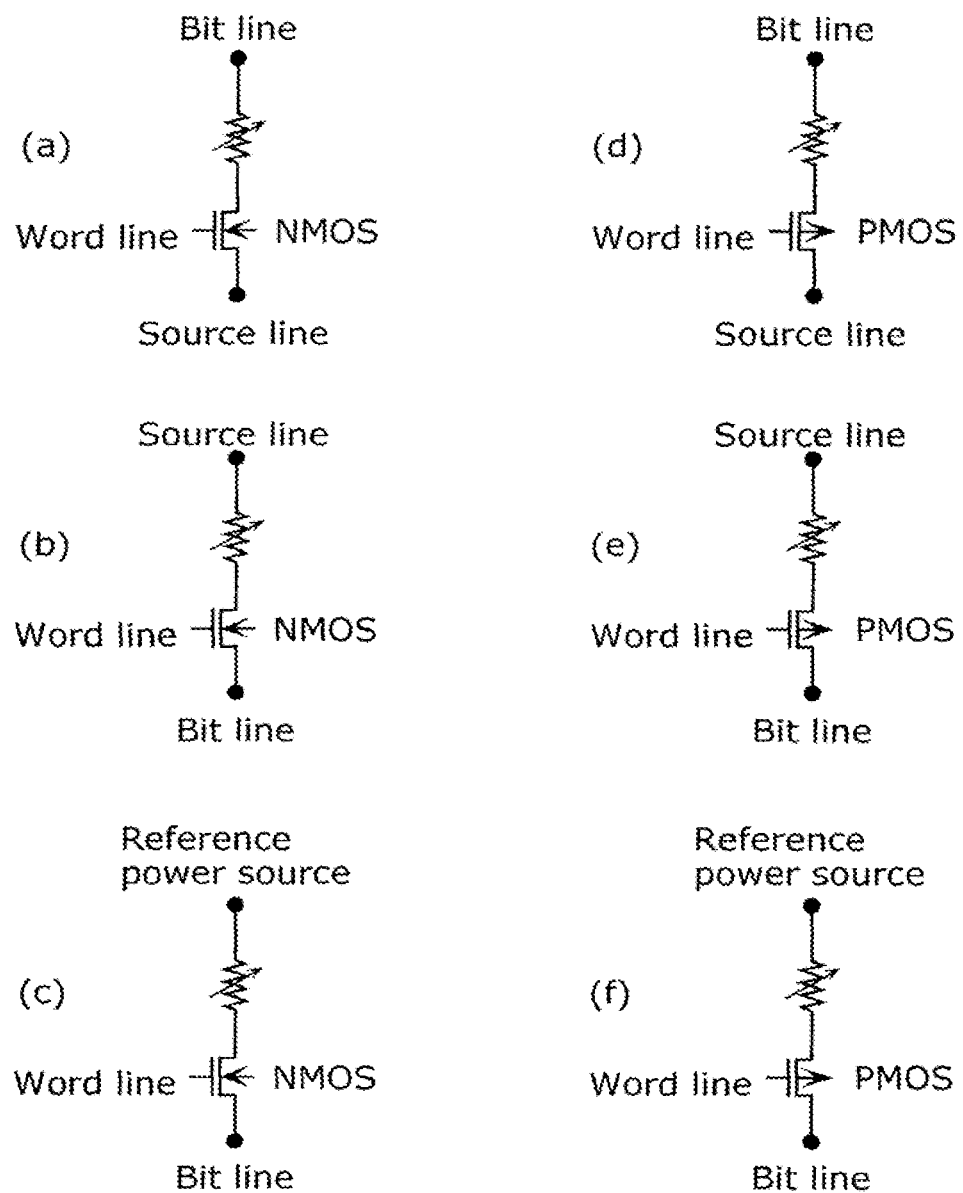
FIG. 25(a) to 25(f) are circuit diagrams each showing a circuit configuration of the memory cell according to the embodiment of the present invention.

FIG. 25(*a*) to 25(*f*) are circuit diagrams showing circuit configurations of a 1T1R memory cell used for a commonly-known variable resistance element, including the 1T1R memory cell described in the embodiment.

FIG. 25(*a*) shows a configuration in which the NMOS transistor described in the embodiment is used.

FIG. 25(*b*) shows a configuration in which a connection relationship between a bit line and a source line is switched with reference to the configuration shown in FIG. 25(*a*).

FIG. 25(*c*) shows a configuration in which the source line is connected to a reference power source which supplies a fixed reference voltage, with reference to the configuration shown in FIG. 25(*b*). In this case, a writing state is controlled by raising or reducing a bit line voltage with reference to the reference voltage.

FIG. 25(*d*) shows a configuration in which a PMOS transistor is used, with reference to the configuration in which the NMOS transistor is used shown in FIG. 25(*a*). In this case, a high potential such as the power supply voltage VDD is supplied to a substrate voltage of the PMOS transistor. In addition, although the configurations differ in that the memory cell is selected by setting a word line to a low level, other control methods are same as in the configuration in which the NMOS transistor is used shown in FIG. 25(*a*).

FIG. 25(*e*) shows a configuration in which a connection relationship between a bit line and a source line is switched with reference to the configuration shown in FIG. 25(*d*).

FIG. 25(*f*) shows a configuration in which the source line is connected to a reference power source which supplies a fixed reference voltage, with reference to the configuration shown in FIG. 25(*e*). In this case, a writing state is controlled by raising or reducing a bit line voltage with reference to the reference voltage.

Figure 26:
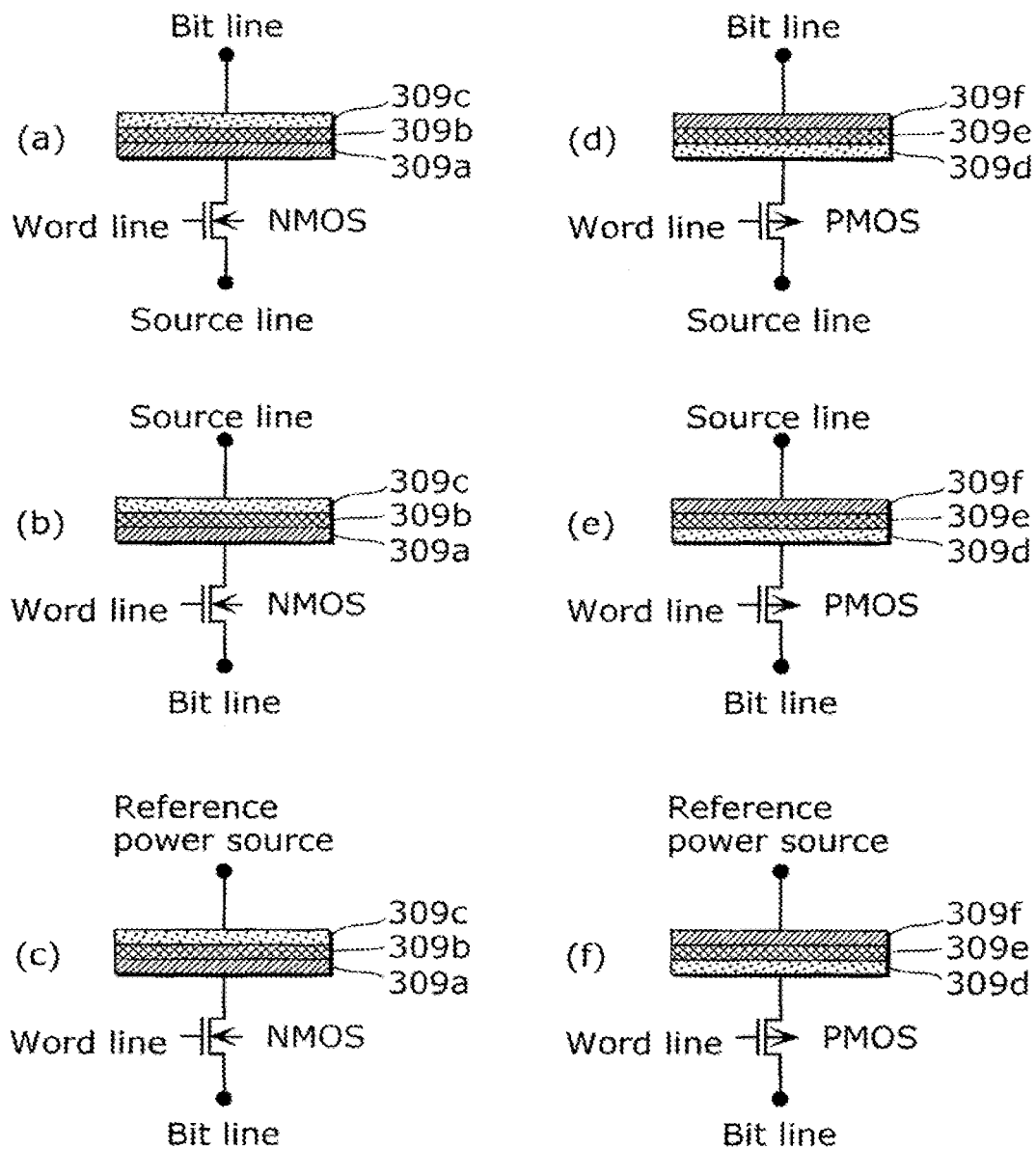
FIG. 26(a) to 26(f) are diagrams each showing a connection relationship between a variable resistance element and a transistor for realizing the memory cell according to the embodiment of the present invention.

FIG. 26(*a*) to 26(*f*) are diagrams showing connection relationships between a variable resistance element and a transistor according to the present invention, the connection relationships being for realizing the circuits shown in FIG. 25(*a*) to 25(*f*).

Here, a variable resistance layer 309*e* is made of an oxygen-deficient tantalum oxide in the same manner as the variable resistance layer 309*b*, a lower electrode 309*d* is made of Pt that is prone to cause the resistance change in the same manner as the component material of the upper electrode 309*c*, and an upper electrode 309*f* is made of W that is the electrode material that is not prone to cause the resistance material in the same manner as the lower electrode 309*a*.

A description of FIG. 26(*a*) is omitted since a configuration shown therein is identical to the configuration shown in FIG. 22(*a*).

FIG. 26(*b*) shows a configuration in which a connection relationship between a bit line and a source line is switched with reference to the configuration shown in FIG. 26(a) and in which the upper electrode 309c made of the electrode material that is prone to cause the resistance change is connected to the source line and the lower electrode 309a made of the electrode material that is not prone to cause the resistance change is connected to the bit line via an NMOS transistor.

In this case also, as with the case of FIG. 26(a), the source line and a word line are wired in the same direction, and the bit line is wired vertically to the source line and the word line.

In a configuration shown in FIG. 26(c), the upper electrode 309c made of the electrode material that is prone to cause the resistance change is connected to a reference power source, and the lower electrode 309a made of the electrode material that is not prone to cause the resistance change is connected to the bit line via the NMOS transistor.

Contrary to the case of FIG. 26(a), FIG. 26(d) shows a configuration in which the upper electrode 309f made of the electrode material that is not prone to cause the resistance change is connected to the bit line and the lower electrode 309d made of the electrode material that is prone to cause the resistance change is connected to the source line via a PMOS transistor. In this case also, as with the case of FIG. 26(a), the source line and a word line are wired in the same direction, and the bit line is wired vertically to the source line and the word line.

FIG. 26(e) shows a configuration in which the connection relationship between the bit line and the source line is switched with reference to the configuration shown in FIG. 26(d) and in which the upper electrode 309f made of the electrode material that is not prone to cause the resistance change is connected to the source line and the lower electrode 309d made of the electrode material that is prone to cause the resistance change is connected to the bit line via the PMOS transistor.

In this case, as with the case of FIG. 26(d), the source line and a word line are wired in the same direction, and the bit line is wired vertically to the source line and the word line.

FIG. 26(f) shows a configuration in which the upper electrode 309f made of the electrode material that is not prone to cause the resistance change is connected to the reference power source and the lower electrode 309d made of the electrode material that is prone to cause the resistance change is connected to the bit line via the PMOS transistor.

Figure 27:
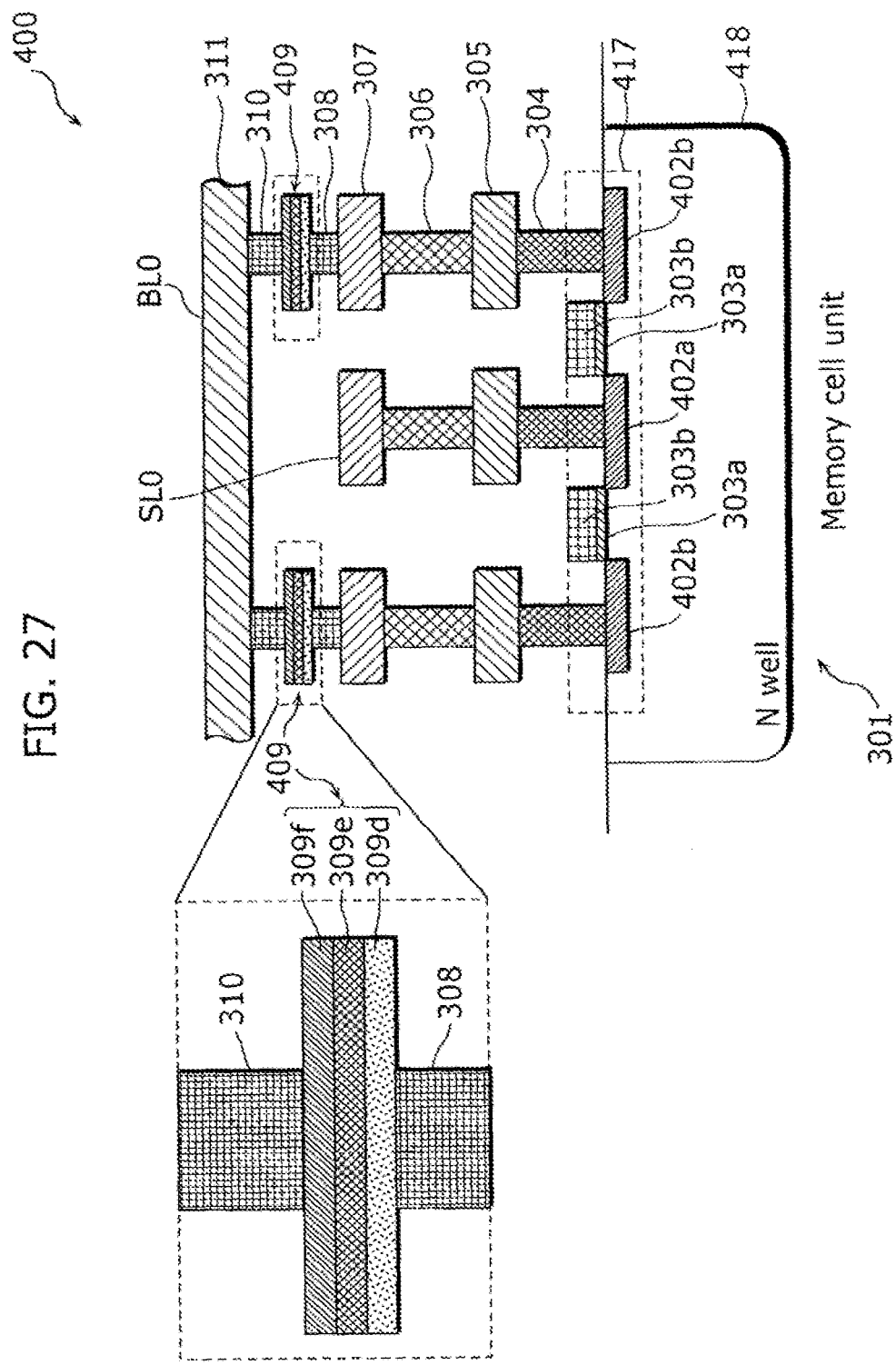
FIG. 27 is a cross-section diagram showing an example of the structure of the memory cell unit of the variable resistance nonvolatile storage device according to the embodiment of the present invention.

FIG. 27 is a cross-section diagram corresponding to the part C (two bits) shown in FIG. 21 and an enlarged view of a variable resistance element 409 in the case where a 1T1R memory cell 400 including a PMOS transistor shown in FIG. 26(d) is applied to a nonvolatile storage device. It is to be noted that the same numeral references are given to component elements common to the memory cell 300 shown in FIG. 22 and overlapping descriptions are omitted.

The memory cell 400 is structured by sequentially forming, above a semiconductor substrate 301, an N well 418, a second P-type diffusion layer region 402a, a first P-type diffusion layer region 402b, a gate insulator film 303a, a gate electrode 303b, a first via 304, a first wiring layer 305, a second via 306, a second wiring layer 307, a third via 308, the variable resistance element 409, a fourth via 310, and a third wiring layer 311.

The third wiring layer 311 connected to the fourth via 310 corresponds to a bit line BL0, and the first and second wiring layers 305 and 307 connected to the second P-type diffusion layer region 402a of a transistor 417 correspond to a source line SL0 extending vertically in the figure. A power supply voltage VDD of a nonvolatile storage device 200 is supplied to the N well by a commonly-known structure via a VDD power source line (not shown).

As shown by the enlarged portion in FIG. 27, the variable resistance element 409 is formed by locating, on the third via 308, the variable resistance layer 309e between the lower electrode 309d and the upper electrode 309f, and is connected to the fourth via 310 that is further connected to the third wiring layer 311.

Here, contrary to the case of the 1T1R memory cell (FIG. 26(a) to 26(c)) including the NMOS transistor, in the case of the 1T1R memory cell (FIG. 26(d) to 26(f)) including the PMOS transistor, the lower electrode 309d connected to the first P-type diffusion layer region 402b of the transistor 417 is made of Pt that is the electrode material that is prone to cause the resistance change, and the upper electrode 309f is made of W that is the electrode material that is not prone to cause the resistance change.

This is a driving direction of the transistor 417 which causes the second P-type diffusion layer region 402a to be a source and approximates a voltage to a voltage (VDD) of the N well 418 which is to be a substrate voltage of the PMOS transistor, that is, a direction in which the lower electrode 309d is set to a high level and the upper electrode 309f is set to a low level, the transistor 417 having little influence of the substrate bias effect and a large current drive capability.

The lower electrode 309d is made of the electrode material that is prone to cause the resistance change and inversely the upper electrode 309f is made of the electrode material that is not prone to cause the resistance change so that the voltage application direction corresponds to a resistance change direction from a low resistance state to a high resistance state, and when the positive voltage is applied to the lower electrode 309d with reference to the upper electrode 309f, an oxidation phenomenon progresses in the vicinity of the interface of the lower electrode 309d and the high resistance state is achieved.

It is to be noted that although there are many cases where the NMOS transistor is generally used for the 1T1R memory cell, the following cases are conceivable as cases where the memory cell includes the PMOS transistor.

For instance, there is a case where only a threshold voltage of a transistor of a selected memory cell is set to be low in order to obtain a larger driving current of the transistor in the selected memory cell. In this case, a leak current to non-selected memory cells other than the selected memory cell increases, the non-selected memory cells being connected to a bit line to which the selected memory cell belongs. As a result, it is considered that reading characteristics are deteriorated.

A method of forming a structure in which a region of the semiconductor substrate 301 is electrically divided into blocks and reducing the leak current by changing a substrate voltage of a block to which the selected memory cell belongs to so that the threshold voltage of the transistor other than the block becomes higher can be considered as one of methods of avoiding the increase in the leak current while maintaining the driving current of the selected memory cell.

Generally, in many CMOS semiconductor devices, the semiconductor substrate 301 is made of a P-type silicon semiconductor. Thus, when such a structure is implemented, it is necessary to adopt a well structure known as, for instance, a triple-well structure and to electrically divide the substrate region into blocks in the case where the transistor of the memory cell includes the NMOS transistor. In this case, a new manufacturing step needs to be added, which leads to an increase in cost.

On the other hand, since it is only necessary to layout design the N well 418 in a desired unit and perform blocking on the N well 418 in the case where the transistor of the memory cell includes the PMOS transistor, an advantage for dividing the N well 418 into the blocks without adding the manufacturing step can be considered.

Furthermore, the cross-section diagrams shown in FIGS. 22 and 27 correspond to FIGS. 26(a) and 26(d), respectively.

Since the cross-section diagrams corresponding to FIGS. 26(b) and 26(c) in which the NMOS transistor is included merely differ from the cross-section diagram shown in FIG. 22(a) in the wiring layer to which the source line, the bit line, and the reference power source are connected, a description of the cross-section diagrams is omitted.

In addition, since the cross-section diagrams corresponding to FIGS. 26(e) and 26(f) in which the PMOS transistor is included merely differ from the cross-section diagram shown in FIG. 27 in the wiring layer to which the source line, the bit line, and the reference power source are connected, a description of the cross-section diagrams is omitted.

Table 3 shows, for each of the memory cell structures associated with a corresponding one of FIG. 26(a) to 26(f), a method of controlling the bit line and the source line in the case where low resistance writing is performed on the resistance element and in the case where high resistance writing is performed on the resistance element.

TABLE 3

| Memory Cell Type | Corresponding Figure | Writing for High Resistance | | Writing for Low Resistance | |
| --- | --- | --- | --- | --- | --- |
| | | Bit Line | Source Line | Bit Line | Source Line |
| a | FIG. 26(a) | H | L | L | H |
| b | FIG. 26(b) | L | H | H | L |
| c | FIG. 26(c) | L | | H | |
| d | FIG. 26(d) | L | H | H | L |
| e | FIG. 26(e) | H | L | L | H |
| f | FIG. 26(f) | H | | L | |

It is to be noted that, in the case of the structures shown in FIGS. 26(b) and 26(d), in the block diagram shown in FIG. 21, it is structured that the output V2 of the power source for LR writing 212 is supplied to the write circuit 206 and the output V1 of the power source for HR writing 213 is supplied to the row driver 207.

In addition, in the case of the structures shown in FIGS. 26(c) and 26(f), in the block diagram shown in FIG. 21, a voltage value equal to or higher than a sum of the threshold voltage for high resistance writing $V_{HR}$ of the variable resistance element 309 and the threshold voltage for low resistance writing $V_{LR}$ of the variable resistance element 309 is set to the output V1 of the power source for HR writing 213 supplied to the write circuit 206, and a voltage value approximately half of the sum is set to the output V2 of the power source for LR writing 212 supplied to the row driver 207.

Since the voltage application direction (driving polarity) which stably causes the resistance change in the direction (low resistance change or high resistance change) is uniquely determined based on Table 3, it is not necessary to manage the information identifying the mode of the resistance change characteristics, and the simple and inexpensive circuit configuration can be achieved.

It is to be noted that although the examples where the oxygen-deficient tantalum oxide or the hafnium oxide is used as the variable resistance layer are described in the above embodiment, the present invention is not limited to the examples, and can be applied to the nonvolatile storage element in which the oxygen-deficient oxide film of another transition metal is used for the variable resistance layer.

It is to be noted that although Pt is used as the electrode material that is prone to cause the resistance change in the present embodiment, Ir, Pd, Ag or Cu may be used alternatively.

Likewise, although W is used as the electrode material that is not prone to cause the resistance change, Ni, Ta, Ti, Al or Ta nitride may be used alternatively.

Industrial Applicability

As described above, since the present invention realizes the variable resistance nonvolatile storage device in a small layout area, the present invention is useful, for example, in realizing a memory having high integration and a small area, the variable resistance nonvolatile storage device including the 1T1R memory cells each of which the variable resistance element is used for.

The invention claimed is:

1. A variable resistance nonvolatile storage device comprising:
    a semiconductor substrate;
    a nonvolatile storage element including: a first electrode; a second electrode; and a variable resistance layer in which a resistance value reversibly varies between a high resistance state and a low resistance state based on electrical signals each having a different polarity, said variable resistance layer being interposed between said first and second electrodes and provided in contact with said first and second electrodes, and the electrical signals being applied between said first and second electrodes; and
    an N-type MOS transistor including: a first N-type diffusion layer region formed on a main surface of said semiconductor substrate; a gate; and a second N-type diffusion layer region formed on a side of said gate which is opposite to said first N-type diffusion layer region,
    wherein said variable resistance layer includes an oxygen-deficient oxide of a transition metal,
    said first and said second electrodes are made of materials of different elements,
    a standard electrode potential $V_1$ of said first electrode, a standard electrode potential $V_2$ of said second electrode, and a standard electrode potential $V_t$ of the transition metal satisfy $V_t < V_2$ and $V_1 < V_2$, and
    said first electrode is connected with said first N-type diffusion layer region of said N-type MOS transistor to form a memory cell.

2. The variable resistance nonvolatile storage device according to claim 1,
    wherein the resistance value of said nonvolatile storage element varies into $R_H$ when a voltage that is higher than a positive voltage $V_{HR}$ with reference to a voltage of said first electrode is applied to said second electrode, and
    the resistance value of said nonvolatile storage element varies into $R_L$ that is smaller than $R_H$, when a voltage that is higher than a positive voltage $V_{LR}$ with reference to a voltage of said second electrode is applied to said first electrode.

3. The variable resistance nonvolatile storage device according to claim 2,
    wherein when said nonvolatile storage element is set to the low resistance state, a voltage VDD is applied to said gate, and a positive low resistance writing voltage $V_{WL}$ is applied to said second N-type diffusion layer region with reference to said second electrode, and
    when said nonvolatile storage is set to the high resistance state, the voltage VDD is applied to said gate, and a positive high resistance writing voltage $V_{WH}$ is applied to said second electrode with reference to said second N-type diffusion layer region, where $|V_{WL}|>|V_{WH}|>|V_{HR}|$.

4. The variable resistance nonvolatile storage device according to claim 2, further comprising:
bit lines;
source lines; and
a driving circuit which drives said bit lines and said source lines,
wherein said memory cell is provided for each combination of one of said bit lines and one of said source lines,
said second electrode of said nonvolatile storage element of each of said memory cells is connected to a corresponding one of said bit lines,
said second N-type diffusion layer region of said N-type MOS transistor of each of said memory cells is connected to a corresponding one of said source lines, and
said driving circuit sets a voltage of said corresponding bit line to be higher than a voltage of said corresponding source line and the voltage of said second electrode to be higher than the positive voltage $V_{HR}$ with reference to the voltage of said first electrode in order that said nonvolatile storage element is caused to change into the high resistance state, and sets the voltage of said corresponding source line to be higher than the voltage of said corresponding bit line and the voltage of said first electrode to be higher than the positive voltage $V_{LR}$ with reference to the voltage of said second electrode in order that said nonvolatile storage element is caused to change into the low resistance state.

5. The variable resistance nonvolatile storage device according to claim 2, further comprising:
bit lines;
source lines; and
a driving circuit which drives said bit lines and said source lines,
wherein said memory cell is provided for each combination of one of said bit lines and one of said source lines,
said second electrode of said nonvolatile storage element of each of said memory cells is connected to a corresponding one of said source lines,
said second N-type diffusion layer region of said N-type MOS transistor of each of said memory cells is connected to a corresponding one of said bit lines, and
said driving circuit sets a voltage of said corresponding source line to be higher than a voltage of said corresponding bit line and the voltage of said second electrode to be higher than the positive voltage $V_{HR}$ with reference to the voltage of said first electrode in order that said nonvolatile storage element is caused to change into the high resistance state, and sets the voltage of said corresponding bit line to be higher than the voltage of said corresponding source line and the voltage of said first electrode to be higher than the positive voltage $V_{LR}$ with reference to the voltage of said second electrode in order that said nonvolatile storage element is caused to change into the low resistance state.

6. The variable resistance nonvolatile storage device according to claim 1,
wherein the transition metal is one of tantalum and hafnium.

7. The variable resistance nonvolatile storage device according to claim 1,
wherein the standard electrode potential $V_i$ of said first electrode and the standard electrode potential $V_t$ of the transition metal further satisfy $V_1 \leq V_t$.

8. The variable resistance nonvolatile storage device according to claim 1,
wherein said second electrode is selected from a group of platinum, iridium, palladium, silver, copper, and gold, and
said first electrode is selected from a group of tungsten, nickel, tantalum, titanium, aluminum, tantalum nitride, and titanium nitride.

9. The variable resistance nonvolatile storage device according to claim 1,
wherein said second electrode is selected from a group of tungsten, copper, platinum, and gold, and
said first electrode is selected from a group of aluminum, titanium, hafnium, tantalum nitride, and titanium nitride.

10. The variable resistance nonvolatile storage device according to claim 1,
wherein said variable resistance layer includes the tantalum oxide, and is composed to satisfy $0.8 \leq x \leq 1.9$ when the tantalum oxide is shown as $TaO_x$.

11. A variable resistance nonvolatile storage device comprising:
a semiconductor substrate;
a nonvolatile storage element including: a first electrode; a second electrode; and a variable resistance layer in which a resistance value reversibly varies between a high resistance state and a low resistance state based on electrical signals each having a different polarity, said variable resistance layer being interposed between said first and second electrodes and provided in contact with said first and second electrodes, and the electrical signals being applied between said first and second electrodes;
an N well formed on a main surface of said semiconductor substrate; and
a P-type MOS transistor including: a first P-type diffusion layer region formed in a region of said N well; a gate; and a second P-type diffusion layer region formed on a side of said gate which is opposite to said first P-type diffusion layer region,
wherein said variable resistance layer includes an oxygen-deficient oxide of a transition metal,
said first and second electrodes are made of materials of different elements,
a standard electrode potential $V_i$ of said first electrode, a standard electrode potential $V_2$ of said second electrode, and a standard electrode potential $V_t$ of the transition metal satisfy $V_t < V_2$ and $V_1 < V_2$, and
said second electrode is connected with said first P-type diffusion layer region of said P-type MOS transistor to form a memory cell.

12. The variable resistance nonvolatile storage device according to claim 11,
wherein the resistance value of said nonvolatile storage element varies into $R_H$ when a voltage that is higher than a positive voltage $V_{HR}$ with reference to a voltage of said first electrode is applied to said second electrode, and
the resistance value of said nonvolatile storage element varies into $R_L$ that is smaller than $R_H$, when a voltage that is higher than a positive voltage $V_{LR}$ with reference to a voltage of said second electrode is applied to said first electrode.

13. The variable resistance nonvolatile storage device according to claim 12, further comprising:
bit lines;
source lines; and
a driving circuit which drives said bit lines and said source lines, wherein said memory cell is provided for each combination of one of said bit lines and one of said source lines, said first electrode of said nonvolatile storage element of each of said memory cells is connected to a corresponding one of said bit lines, said second P-type diffusion layer region of said P-type MOS transistor of each of said memory cells is connected to a corresponding one of said source lines, and said driving circuit sets a voltage of said corresponding source line to be higher than a voltage of said corresponding bit line and the voltage of said second electrode to be higher than the positive voltage $V_{HR}$ with reference to the voltage of said first electrode in order that said nonvolatile storage element is caused to change into the high resistance state, and sets the voltage of said corresponding bit line to be higher than the voltage of said corresponding source line and the voltage of said first electrode to be higher than the positive voltage $V_{LR}$ with reference to the voltage of said second electrode in order that said nonvolatile storage element is caused to change into the low resistance state.

14. The variable resistance nonvolatile storage device according to claim 12, further comprising:
   bit lines;
   source lines; and
   a driving circuit which drives said bit lines and said source lines,
   wherein said memory cell is provided for each combination of one of said bit lines and one of said source lines,
   said first electrode of said nonvolatile storage element of each of said memory cells is connected to a corresponding one of said source lines,
   said second P-type diffusion layer region of said P-type MOS transistor of each of said memory cells is connected to a corresponding one of said bit lines, and
   said driving circuit sets a voltage of said corresponding bit line to be higher than a voltage of said corresponding source line and the voltage of said second electrode to be higher than the positive voltage $V_{HR}$ with reference to the voltage of said first electrode in order that said nonvolatile storage element is caused to change into the high resistance state, and sets the voltage of said corresponding source line to be higher than the voltage of said corresponding bit line and the voltage of said first electrode to be higher than the positive voltage $V_{LR}$ with reference to the voltage of said second electrode in order that said nonvolatile storage element is caused to change into the low resistance state.

15. The variable resistance nonvolatile storage device according to claim 11,
   wherein the transition metal is one of tantalum and hafnium.

16. The variable resistance nonvolatile storage device according to claim 11,
   wherein the standard electrode potential $V_i$ of said first electrode and the standard electrode potential $V_t$ of the transition metal further satisfy $V_1 \leq V_t$.

17. The variable resistance nonvolatile storage device according to claim 11,
   wherein said second electrode is selected from a group of platinum, iridium, palladium, silver, copper, and gold, and
   said first electrode is selected from a group of tungsten, nickel, tantalum, titanium, aluminum, tantalum nitride, and titanium nitride.

18. The variable resistance nonvolatile storage device according to claim 11,
   wherein said second electrode is selected from a group of tungsten, copper, platinum, and gold, and
   said first electrode is selected from a group of aluminum, titanium, hafnium, tantalum nitride, and titanium nitride.

19. The variable resistance nonvolatile storage device according to claim 11,
   wherein said variable resistance layer includes the tantalum oxide, and is composed to satisfy $0.8 \leq x \leq 1.9$ when the tantalum oxide is shown as $TaO_x$.

* * * * *